US006759839B2

United States Patent
Kodato

(10) Patent No.: US 6,759,839 B2
(45) Date of Patent: Jul. 6, 2004

(54) WIDE-BAND RF SIGNAL POWER DETECTING ELEMENT AND POWER DETECTING DEVICE USING THE SAME

(75) Inventor: Setsuo Kodato, Atsugi (JP)

(73) Assignee: Anritsu Corporation, Tokyo (JP)

( * ) Notice: Subject to any disclaimer, the term of this patent is extended or adjusted under 35 U.S.C. 154(b) by 26 days.

(21) Appl. No.: 10/313,449

(22) Filed: Dec. 6, 2002

(65) Prior Publication Data

US 2003/0076085 A1 Apr. 24, 2003

Related U.S. Application Data

(62) Division of application No. 09/462,653, filed on Jan. 11, 2000, now Pat. No. 6,518,743.

(51) Int. Cl.[7] .......................... G01R 21/04; G01R 21/10
(52) U.S. Cl. .......................................... 324/95; 324/106
(58) Field of Search .......................... 324/95, 105, 106, 324/132; 136/207, 225; 340/600; 343/703; 455/67.11, 115.3, 115.4

(56) References Cited

U.S. PATENT DOCUMENTS

| 2,314,764 A | 3/1943 | Brown |
| 2,782,377 A | 2/1957 | Selby |
| 2,995,708 A | 8/1961 | Hudson et al. |
| 3,447,083 A | 5/1969 | Luskow |
| 4,733,170 A | 3/1988 | McAllister et al. |
| 4,789,823 A | * 12/1988 | Delfs et al. .................... 324/95 |
| 4,943,764 A | 7/1990 | Szente et al. |
| 5,783,805 A | * 7/1998 | Katzmann .................... 219/494 |

FOREIGN PATENT DOCUMENTS

| DE | 3428077 A1 | 5/1985 |
| DE | 256 628 A3 | 5/1988 |
| GB | 1090613 | 11/1967 |
| JP | 55-97574 | 7/1980 |
| JP | 1-196580 | 8/1989 |
| JP | 5-25361 | 4/1993 |
| WO | WO88/03319 | 5/1988 |

* cited by examiner

Primary Examiner—Ernest Karlsen
(74) Attorney, Agent, or Firm—Frishauf, Holtz, Goodman & Chick, P.C.

(57) ABSTRACT

A wide-band RF signal power detecting element includes, on an insulating substrate (21), at least one thin-film resistor (22a) for absorbing the power of a signal to be measured and generating heat, first and second ground electrodes (27, 28) formed by thin-film conductors, a first thin-film connecting portion (24) for electrically connecting the first ground electrode (27) to the thin-film resistor (22a), a second thin-film connecting portion (25) for electrically connecting the second ground electrode (28) to the thin-film resistor (22a) and narrowing the gap between the first and second thin-film connecting portions (24, 25) toward the thin-film resistor (22a), and an input electrode (26) formed between the first and second ground electrodes (27, 28) and electrically connected to the thin-film resistor (22a).

2 Claims, 15 Drawing Sheets

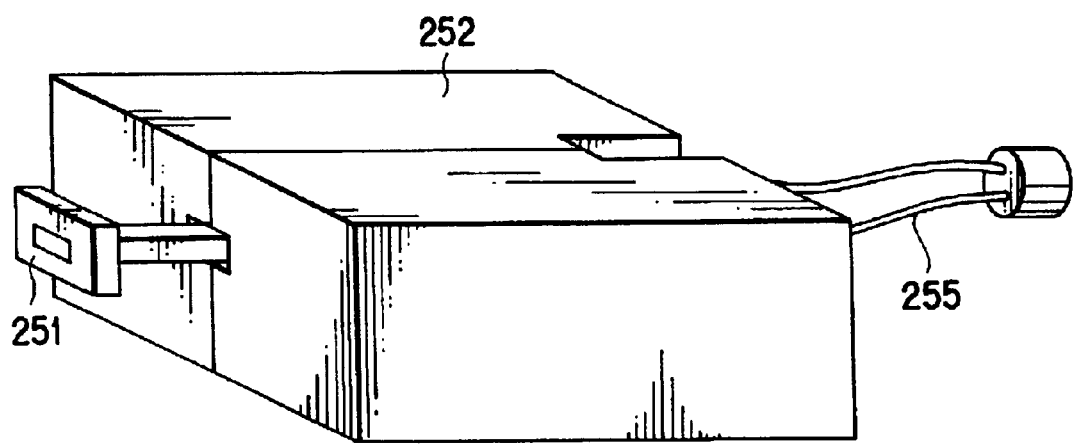
F I G. 28A
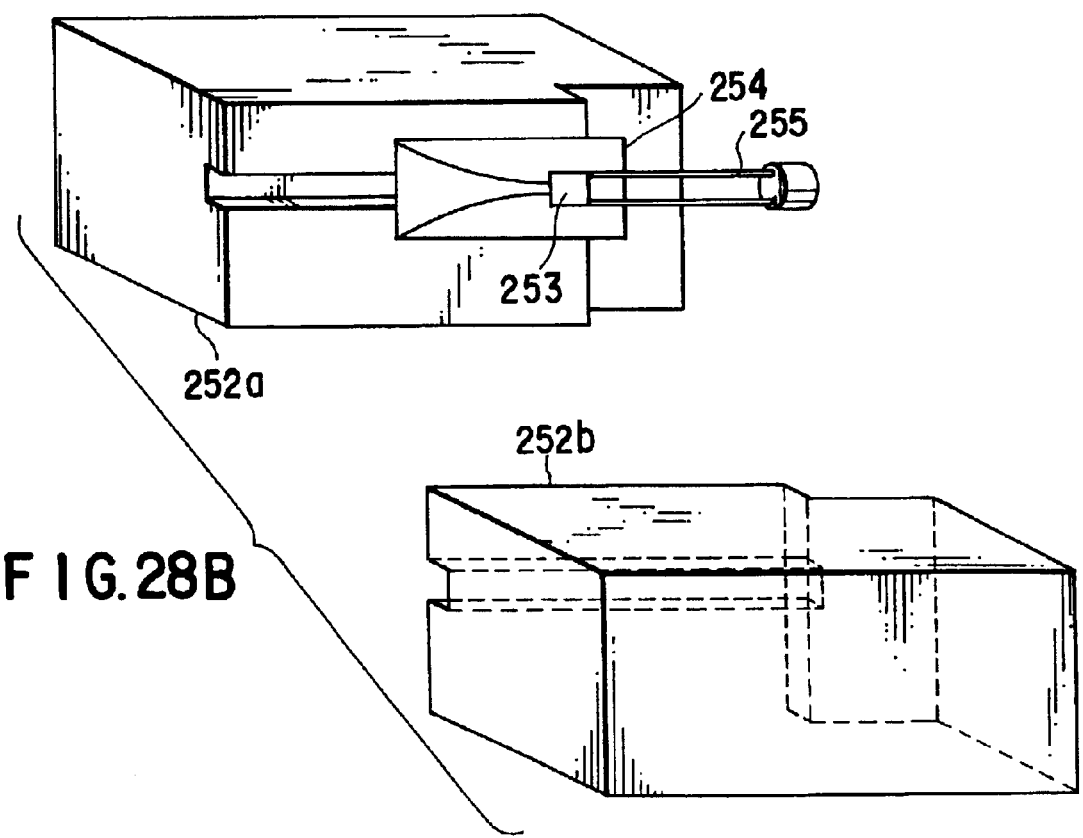
F I G. 28B

WIDE-BAND RF SIGNAL POWER DETECTING ELEMENT AND POWER DETECTING DEVICE USING THE SAME

This application is a Division of application Ser. No. 09/462,653 filed Jan. 11, 2000 now U.S. Pat. No. 6,518,743.

TECHNICAL FIELD

The present invention relates to a power detecting element for detecting the power of a wide-band RF signal and a power detecting device using the same and, more particularly, to a wide-band RF signal power detecting element which has an improved frequency characteristic and can be easily manufactured, and a power detecting device using the same.

BACKGROUND ART

As is well known, to detect the power of a RF signal over a wide band, it is possible to use a diode detecting system which detects a signal by using a diode and a thermocouple system which allows a resistor to absorb a signal and detects heat generated by the resistor by using a thermocouple.

The diode detecting system has the advantage that a response is obtained with almost no delay when an input signal is supplied to the diode.

This diode detecting system, however, has the problem that the detection accuracy is low because the system is readily influenced by the signal waveform and the signal level.

Additionally, the junction capacitance of the diode makes it difficult for the diode detecting system to detect the power of a RF signal of millimeter waves or more.

On the other hand, the thermocouple system cannot achieve such high-speed responses as in the diode detecting system, because heat is generated by supplying a signal to the resistor.

This thermocouple system, however, has the advantage that the system can accurately detect the power of a signal without being influenced by the signal waveform.

The present applicant has disclosed a power detector (element) and a power detecting device using this thermocouple system in International Publication No. WO88/03319 (Japanese Patent Application No. 62-506672).

As shown in FIG. 20, this power detector includes a first thermocouple 4A and a second thermocouple 4B formed on an insulating substrate 1. The first thermocouple 4A is formed by connecting a metal thin-film conductor 3A to a silicon germanium mixed-crystal thin film 2A. The second thermocouple 4B is formed by connecting a metal thin-film conductor 3B to a silicon germanium mixed-crystal thin film 2B.

In this structure, the silicon germanium mixed-crystal thin film of the first thermocouple 4A and the metal thin-film conductor 3B of the second thermocouple 4B are formed parallel to oppose each other.

End portions of the silicon germanium mixed-crystal thin film 2A of the first thermocouple 4A and the metal thin-film conductor 3B of the second thermocouple 4B are connected by a first electrode 5.

A second electrode 6 is connected to the metal thin-film conductor 3A of the first thermocouple 4A.

A third electrode 7 is connected to the silicon germanium mixed-crystal thin film 2B of the second thermocouple 4B.

The electromotive forces of the first and second thermocouples 4A and 4B are added and output to between the second and third electrodes 6 and 7.

Beam lead electrodes 8, 9, and 10 for decreasing the thermal resistance in a cold junction between the first and second thermocouples 4A and 4B are connected to the first, second, and third electrodes 5, 6, and 7, respectively.

This power detector is mounted on a dielectric substrate 11 of a power detecting device shown in FIG. 21.

This dielectric substrate 11 has a transmission line composed of a central conductor 12 having a predetermined width and external conductors 13A and 13B formed parallel with a predetermined spacing between them on the two sides of the central conductor 12.

The beam lead electrode 8 of this power detector 14 constructed as shown in FIG. 20 is connected to the central conductor 12 on the dielectric substrate 11.

The beam lead electrode 9 of the power detector 14 is connected to ground (GND) which communicates with the external conductor 13B on the dielectric substrate 11.

The beam lead electrode 10 of the power detector 14 is connected to an output conductor 15 on the dielectric substrate 11.

The central conductor 12 on the dielectric substrate 11 is connected to a connecting portion 17 via a coupling capacitor 16.

The output conductor 15 on the dielectric substrate 11 is connected to ground (GND) which communicates with the external conductor 13A via a bypass capacitor 18.

A lead line 19A for central conductor output is connected to the output conductor 15.

A lead line 19B for GND output is connected to the ground (GND) which communicates with the external conductor 13B.

FIG. 22 shows an equivalent circuit of this power detecting device.

That is, a signal S to be measured input from the connecting portion 17 is supplied to the two thermocouples 4A and 4B via the coupling capacitor 16, and these two thermocouples 4A and 4B generate heat.

The electromotive forces generated in the two thermocouples 4A and 4B by the heat generated by these two thermocouples 4A and 4B are added and output from the lead lines 19A and 19B.

In the power detecting device constructed as above, the upper-limit value of a band in which the sensitivity lowers by 1 dB extends to 32 GHz.

In addition to the above system (so-called direct heating type), a so-called indirect heating system is also proposed as the thermocouple system. In this indirect heating system, a resistor for converting a power signal to be measured into heat, i.e., an input resistor, and a thermocouple for detecting a temperature rise resulting from the heat generated by this resistor, are separated from each other.

This indirect heating type thermocouple has a longer response time than that of the direct heating type thermocouple. However, the number of thermocouples can be arbitrarily increased independently of the resistor, and a signal having magnitude directly proportional to the number of these thermocouples can be output.

Accordingly, this indirect heating type thermocouple has the advantage that high detectivity is obtained. Thermocouples having frequency characteristics of about 20-odd GHz have been realized.

In the power detector and the power detecting device using the direct heating type thermocouples described above, a signal is supplied to the thermocouples themselves to cause these thermocouples to output DC electromotive forces. Hence, the power of a DC signal cannot be detected. Also, since the capacitance of a capacitor formable on a substrate is limited, the power of a low-frequency signal cannot be accurately detected.

Additionally, in the power detector and the power detecting device using the direct heating type thermocouples described above, the two thermocouples split the load on an input signal, and impedance matching is difficult owing to the influence of the capacitor. Therefore, it is difficult to further extend the upper-limit detection frequency.

Furthermore, in the power detector and the power detecting device using the direct heating type thermocouples described above, a larger number of thermocouples must be provided in the power detecting element in order to detect micro watt power at high sensitivity.

Unfortunately, in the power detector and the power detecting device using the direct heating type thermocouples described above, if the number of thermocouples is increased, the number of necessary capacitors increases accordingly. This makes impedance matching more difficult. As a consequence, the frequency characteristic must be sacrificed.

Especially in recent years, RF communication apparatuses using millimeter waves and microwaves are extensively developed.

To measure these communication apparatuses, it is increasingly demanded to accurately detect the power of signals with higher frequencies. However, the conventional power detecting elements and power detecting devices described above cannot satisfactorily meet this demand.

Also, in the power detector and the power detecting device using the direct heating type thermocouples described above, electronic materials forming the input resistor and the thermocouple are different. This complicates the manufacturing method. Additionally, no knowledge for effectively controlling the difference between the shape of the input resistor electrode and the shape of the resistor has been obtained.

That is, in the power detector and the power detecting device using the direct heating type thermocouples, no knowledge about optimum wiring patterns for connecting the input resistor electrode to the resistor has been obtained. Consequently, the upper limit of measurable frequencies is about 20-odd GHz as mentioned earlier.

DISCLOSURE OF INVENTION

The present invention has been made in consideration of the above situation, and has as its object to provide a wide-band RF signal power detecting element which is easy to manufacture, has a high upper-limit detection frequency, can detect power from direct current, and has a frequency characteristic not influenced by the number of thermocouples.

It is another object of the present invention to provide a power detecting device using a wide-band RF power detecting element which is easy to manufacture, has a high upper-limit detection frequency, can detect power from direct current, and has a frequency characteristic not influenced by the number of thermocouples.

According to one aspect of the present invention, there is provided a wide-band RF signal power detecting element comprising an insulating substrate,
a thin-film resistor formed on the substrate to absorb power of a signal to be measured and generate heat,
first and second ground electrodes formed by thin-film conductors, adjacent to an edge of the substrate, and separated from each other,
a first thin-film connecting portion formed on the substrate to electrically connect the first ground electrode to the thin-film resistor,
a second thin-film connecting portion formed on the substrate to electrically connect the second ground electrode to the thin-film resistor, made to narrow a gap between the first and second thin-film connecting portions toward the thin-film resistor, and connected to the thin-film resistor with the thin-film resistor interposed between the first and second thin-film connecting portions, and
a thin-film thermocouple formed adjacent to and away from the thin-film resistor with a predetermined gap between them to detect a temperature rise of the thin-film resistor.

According to another aspect of the present invention, there is provided a wide-band RF signal power detecting element comprising an insulating substrate,
at least one thin-film resistor formed on the substrate to absorb power of a signal to be measured and generate heat,
first and second ground electrodes formed by thin-film conductors, adjacent to an edge of the substrate, and separated from each other,
a first thin-film connecting portion formed on the substrate to electrically connect the first ground electrode to the at least one thin-film resistor,
a second thin-film connecting portion formed on the substrate to electrically connect the second ground electrode to the at least one thin-film resistor, and made to narrow a gap between the first and second thin-film connecting portions toward the at least one thin-film resistor,
an input electrode formed adjacent to the edge of the substrate and between the first and second ground electrodes,
an input connecting portion connected to the at least one thin-film resistor, with the at least one thin-film resistor interposed between the first and second thin-film connecting portions, to electrically connect the input electrode to the at least one thin-film resistor, such that a width of the input connecting portion decreases from the input electrode toward the at least one thin-film resistor, and that gaps between the input connecting portion and the first and second thin-film connecting portions narrow toward the at least one thin-film resistor, and
a thin-film thermocouple formed adjacent to and away from the at least one thin-film resistor with a predetermined gap between them to detect a temperature rise of the at least one thin-film resistor.

According to still another aspect of the present invention, there is provided a power detecting device comprising
a power detecting element comprising
an insulating substrate,
at least one thin-film resistor formed on the substrate to absorb power of a signal to be measured and generate heat,
first and second ground electrodes formed by thin-film conductors, adjacent to an edge of the substrate, and separated from each other, a first thin-film connecting portion formed on the substrate to electrically connect the first ground electrode to the at least one thin-film resistor, a second thin-film connecting portion formed on the substrate to electrically connect the second ground electrode to the at least one thin-film resistor, and made to narrow a gap between the first and second thin-film connecting portions toward the at least one thin-film resistor, an input electrode formed adjacent to the edge of the substrate and between the first and second ground electrodes, an input connecting portion connected to the at least one thin-film resistor, with the at least one thin-film resistor interposed between the first and second thin-film connecting portions, to electrically connect the input electrode to the at least one thin-film resistor, such that a width of the input connecting portion decreases from the input electrode toward the at least one thin-film resistor, and that gaps between the input connecting portion and the first and second thin-film connecting portions narrow toward the at least one thin-film resistor, and a thin-film thermocouple formed away from the at least one thin-film resistor with a predetermined gap between them to detect a temperature rise of the at least one thin-film resistor, and a module substrate made larger than the substrate of the wide-band RF signal power detecting element, and comprising a central conductor and a ground conductor formed by patterning on one surface of the module substrate to guide a signal to be measured, and mount portions formed, in one-to-one correspondence with the electrodes of the wide-band RF signal power detecting element, at a distal end of the central conductor and in a portion of the ground conductor in the vicinity of the distal end of the central conductor, the module substrate fixing the wide-band RF signal power detecting element to the one surface with the electrodes of the power detecting element joined to the mount portions, supplying a signal to be measured to between the electrodes of the wide-band RF signal power detecting element, and outputting a signal corresponding to power of the signal to be measured, characterized in that transmission impedance between the central conductor and the ground conductor of the module substrate is made substantially equal to transmission impedance between the electrodes of the wide-band RF signal power detecting element, and the central conductor is given an inductance component corresponding to a capacitance component increased by junctions between the mount portions and the electrodes of the wide-band RF signal power detecting element.

BRIEF DESCRIPTION OF DRAWINGS

FIG. 28A is a perspective view showing the packaged state of a waveguide type wide-band RF signal power detecting device (power sensor) according to the sixth embodiment of the present invention; and FIG. 28B is an exploded perspective view showing the waveguide type wide-band RF signal power detecting device (power sensor) according to the sixth embodiment of the present invention.

BEST MODE FOR CARRYING OUT THE INVENTION

Figure 1:
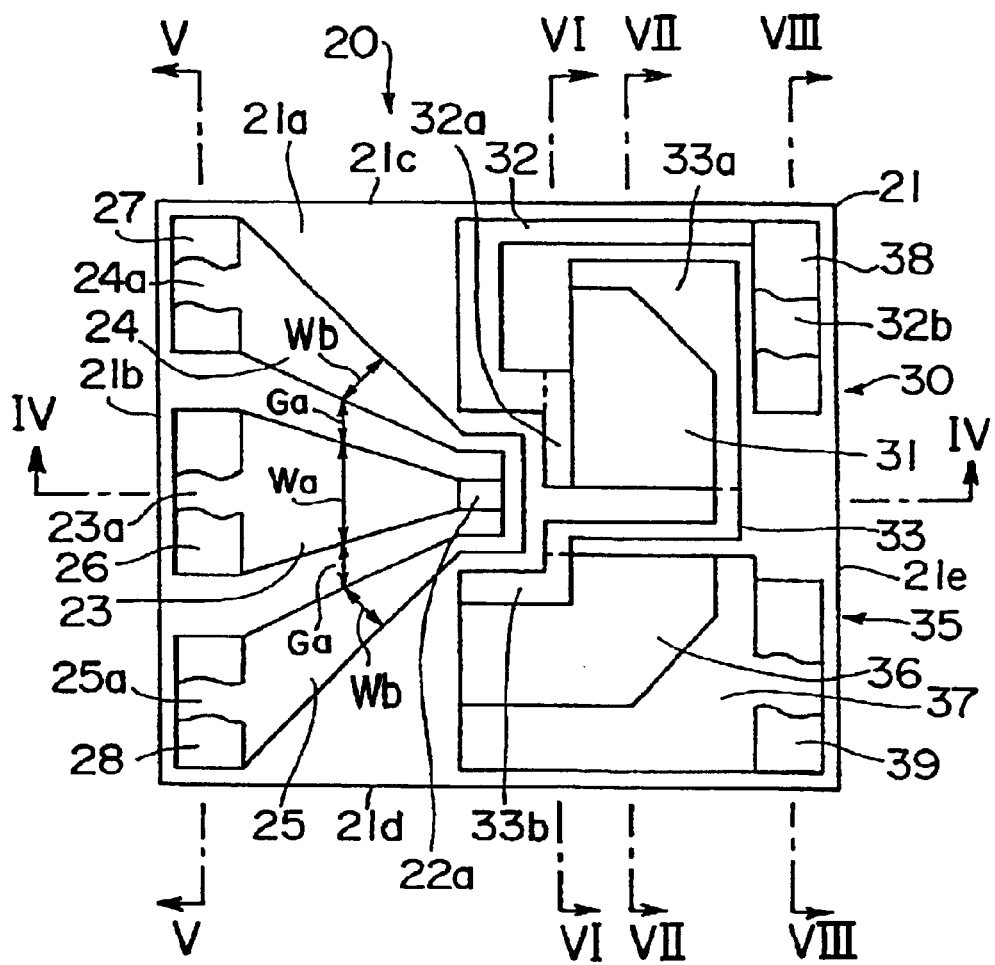
FIG. 1 is a plan view showing a wide-band RF signal power detecting element according to the first embodiment of the present invention.
Figure 2:
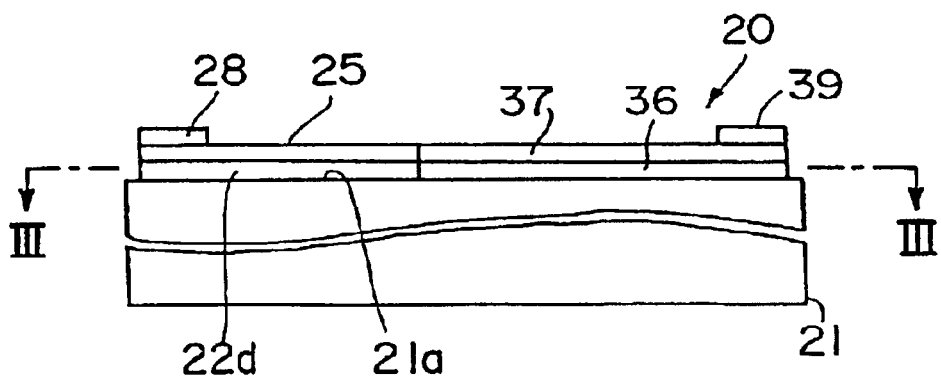
FIG. 2 is a side view showing the wide-band RF signal power detecting element according to the first embodiment of the present invention.

First, an outline of the present invention will be described below.

A wide-band RF signal power detecting element according to the present invention is based on the finding that the difference between the shape of an electrode for an input resistor and the shape of the resistor in the indirect heating type thermocouple described previously can be coped with.

That is, a wide-band RF signal power detecting element according to the present invention is based on the finding that there are optimum wiring patterns for connecting the input resistor electrode to the resistor and the development of a means capable of greatly broadening the frequency characteristic.

Additionally, a power detecting device according to the present invention is based on the development of a method capable of correcting deterioration of the frequency characteristic resulting from an increase in the capacitance produced between electrodes, when a wide-band RF signal power detecting element according to the present invention is mounted on a coplanar module substrate.

Furthermore, in the conventional indirect heating type devices, electronic materials forming the input resistor and the thermocouple are different. In contrast, a wide-band RF signal power detecting element according to the present invention is based on the fact that a power detecting element having excellent characteristics can be realized even with the use of the same electronic material, i.e., is based on the development of a simple manufacturing method.

More specifically, a first wide-band RF signal power detecting element according to the present invention comprises an insulating substrate (21), a thin-film resistor (22a) formed on the substrate to absorb power of a signal to be measured and generate heat, an input electrode (26) formed by a thin-film metal at one end of the substrate, a ground electrode (27, 28) formed by a thin-film metal at the same end of the substrate, a first connecting portion (23) for electrically connecting one end of the thin-film resistor to the input electrode, a second connecting portion (24, 25) for connecting the other end of the thin-film resistor to the ground electrode, a thin-film thermocouple (30, 35) formed in the vicinity of the thin-film resistor to detect a temperature rise caused by heat generation by the thin-film resistor, and an output electrode (38, 39) formed for the thin-film thermocouple, wherein transmission impedance between the input electrode and first connecting portion and the ground electrode and second connecting portion is held at a predetermined value.

A second wide-band RF signal power detecting element according to the present invention is the first wide-band RF signal power detecting element described above, wherein the thin-film resistor is made smaller than the input electrode and the ground electrode, and the first connecting portion widens toward the input electrode.

A third wide-band RF signal power detecting element according to the present invention is the first or second wide-band RF signal power detecting element described above, wherein the ground electrode and the second connecting portion are so formed as to sandwich the input electrode and the first connecting portion.

A fourth wide-band RF signal power detecting element according to the present invention comprises an insulating substrate (21), first and second thin-film resistors (20a', 20a') formed on the substrate to absorb power of a signal to be measured and generate heat, an input electrode (26) formed by a thin-film metal at one end of the substrate, a pair of ground electrodes (27, 28) formed by a thin-film metal to sandwich the input electrode at the same end of the substrate, a first connecting portion (23) for electrically connecting one end of each of the first and second thin-film resistors to the input electrode, a second connecting portion (24) and a third connecting portion (25) for connecting the other ends of the first and second thin-film resistors, respectively, to the pair of ground electrodes, a thermocouple (30, 35) formed in the vicinity of the first and second thin-film resistors to detect a temperature rise caused by heat generation by the first and second thin-film resistors, and an output electrode (38, 39) formed for the thermocouple, wherein the first and second thin-film resistors are made smaller than the input electrode and the ground electrodes, the first connecting portion widens toward the input electrode, and transmission impedance between the input electrode and first connecting portion and the pair of ground electrodes and second and third connecting portions is held at a predetermined value.

A fifth wide-band RF signal power detecting element according to the present invention comprises an insulating substrate (21), a thin-film resistor (22a) formed on one surface of the substrate to absorb power of a signal to be measured and generate heat, an input electrode (26) formed by a thin-film metal at one end on one surface of the substrate, a pair of ground electrodes (26, 27) formed by a thin-film metal to sandwich the input electrode at the same end on the same surface of the substrate, a first connecting portion formed (23) by a thin-film metal to electrically connect one end of the thin-film resistor to the input electrode on the same surface of the substrate, a second connecting portion (24) and a third connecting portion (25) formed by a thin-film metal to electrically connect the other end of the thin-film resistor to the pair of ground electrodes on the same surface of the substrate, a thermocouple (30, 35) comprising a first thin-film portion formed on a side away from the thin-film resistor with the second connecting portion between them on the same surface of the substrate, and a second thin-film portion made of an electronic material different from the first thin-film portion and connected to the first thin-film portion in a position close to the thin-film resistor, the thermocouple generating a signal corresponding to a temperature rise caused by heat generation by the thin-film resistor, and an output electrode (38, 39) for outputting the signal generated by the thermocouple, wherein the first connecting portion is widened from one end of the thin-film resistor toward the input electrode, and a ratio of a width of the input electrode and the first connecting portion to a gap between the ground electrode and the second connecting portion is held substantially constant, thereby holding transmission impedance between the input electrode and first connecting portion and the ground electrode and second and third connecting portions at a predetermined value.

A sixth wide-band RF signal power detecting element according to the present invention is any one of the first to fifth wide-band RF signal power detecting elements described above, wherein the thin-film resistor and one thin-film portion of the thermocouple are made of a micro-crystalline silicon germanium thin film.

A seventh wide-band RF signal power detecting element according to the present invention is any one of the first to sixth wide-band RF signal power detecting elements described above, wherein a plurality of substantially fan-shaped thermocouples are radially arranged around the thin-film resistor on one surface of the substrate, and the plurality of thermocouples are connected in series.

A first wide-band RF signal power detecting device according to the present invention comprises a power detecting element (20) comprising a substrate, a resistor formed on the substrate, electrodes formed on one surface of the substrate and connected to two ends of the resistor, and a thermocouple for outputting a signal corresponding to heat generated by the resistor, and set such that transmission impedance between the electrodes has a predetermined value, and a module substrate (43) made larger than the substrate of the wide-band RF signal power detecting element, and comprising a central conductor and a ground conductor formed by patterning on one surface of the module substrate to guide a signal to be measured, and mount portions formed, in one-to-one correspondence with the electrodes of the wide-band RF signal power detecting element, at a distal end of the central conductor and in a portion of the ground conductor in the vicinity of the distal end of the central conductor, the module substrate fixing the wide-band RF signal power detecting element to the one surface with the electrodes of the power detecting element joined to the mount portions, supplying a signal to be measured to between the electrodes of the power detecting element, and outputting a signal corresponding to power of the signal to be measured, wherein transmission impedance between the central conductor and the ground conductor of the module substrate is made substantially equal to transmission impedance between the electrodes of the wide-band RF signal power detecting element, and the central conductor is given an inductance component corresponding to a capacitance component increased by junctions between the mount portions and the electrodes of the wide-band RF signal power detecting element.

A second wide-band RF signal power detecting device according to the present invention is the first wide-band RF signal power detecting device described above, wherein the inductance component corresponding to the increased capacitance component is formed in the vicinity of the mount portion of the central conductor.

Each embodiment of the present invention based on the aforementioned outline will be described below with reference to the accompanying drawings.

First Embodiment

A power detecting element 20 according to the first embodiment of the present invention will be described below with reference to FIGS. 1 to 8.

As shown in FIG. 1, this power detecting element 20 is formed on a rectangular insulating sapphire substrate 21 about 1 mm in side length and about 20 $\mu$m (micrometers) thick.

In this embodiment, a sapphire substrate having small dielectric loss and high thermal conductivity is used as the insulating substrate 21. However, it is also possible to use, e.g., glass, fused quartz, and alumina, in addition to sapphire.

Figure 3:
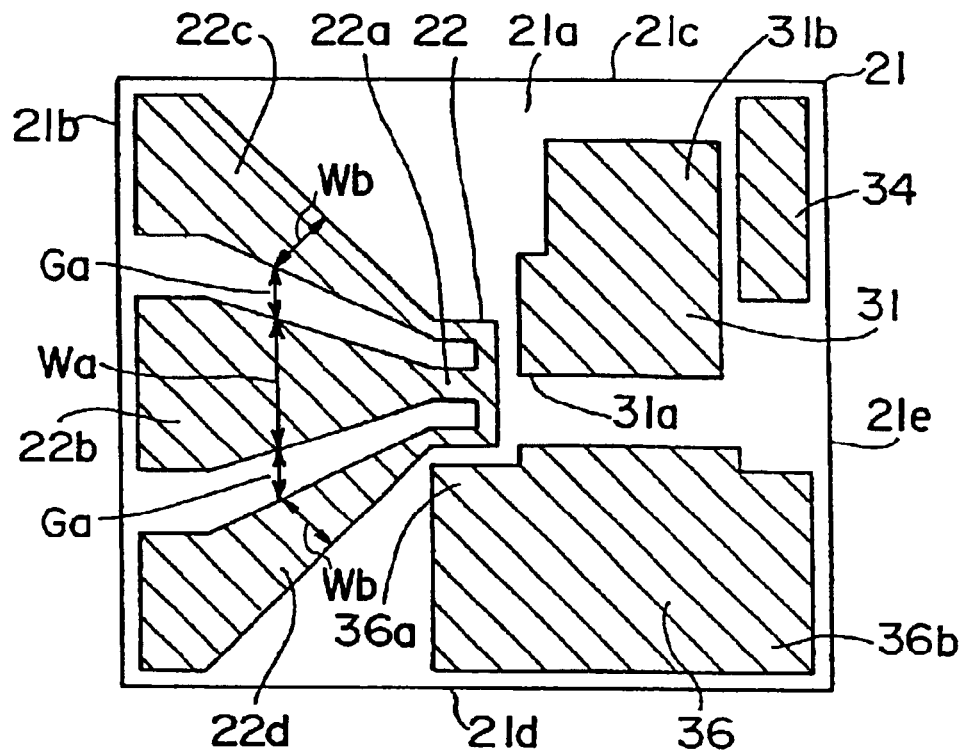
FIG. 3 is a sectional view taken along a line III—III in FIG. 2.

As shown in FIG. 3, a thin-film member 22 made from micro-crystalline silicon germanium is formed from the center of one surface 21a of the substrate 21 to a side 21b.

This thin-film member 22 has a thickness of approximately 1 $\mu$m and is composed of a resistor 22a and first, second, and third extending portions 22b, 22c, and 22d. The first extending portion 22b runs from one end of the resistor 22a to the center of the side 21b of the substrate 21. The second extending portion 22c runs from the other end of the resistor 22a to the corner between the side 21b and a side 21c of the substrate 21. The third extending portion 22d connects with the second extending portion 22c and runs from the other end of the resistor 22a to the corner between the side 21b and a side 21d of the substrate 21.

The first extending portion 22b is axially symmetrical with a line connecting the center of the substrate 21 to the center of the side 21b. Also, a width Wa of this first extending portion 22b in a direction along the side 21b of the substrate 21 monotonically increases in a direction from one end of the resistor 22a to the side 21b of the substrate 21.

A width Wb of the second and third extending portions 22c and 22d in the direction along the side 21b of the substrate 21 and a distance Ga from these second and third extending portions 22c and 22d to the first extending portion 22b increase in direct proportion to the width Wa of the first extending portion 22b.

Figure 4:
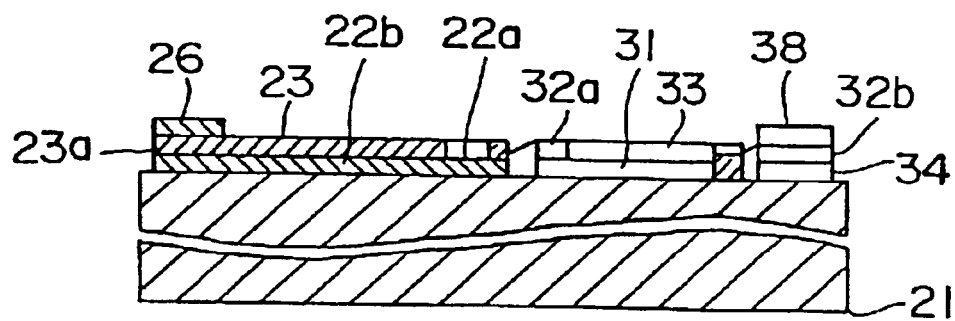
FIG. 4 is a sectional view taken along a line IV—IV in FIG. 1.
Figure 5:
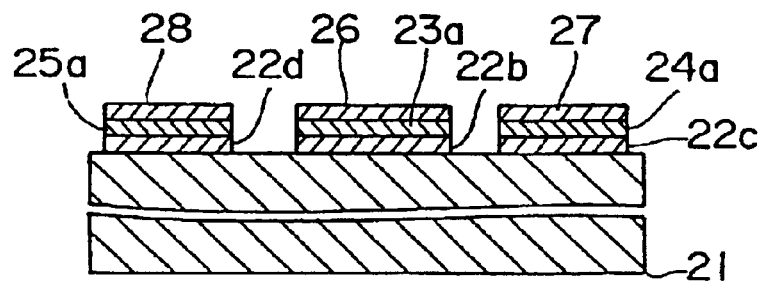
FIG. 5 is a sectional view taken along a line V—V in FIG. 1.
Figure 6:
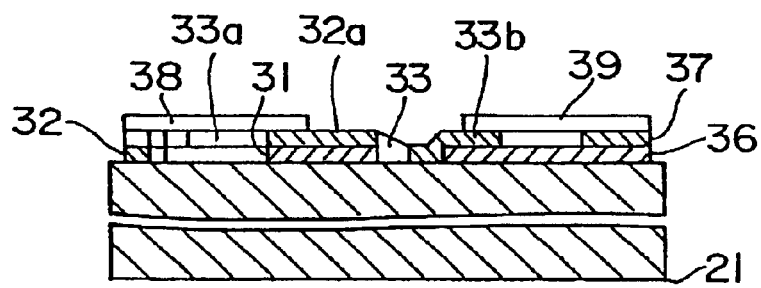
FIG. 6 is a sectional view taken along a line VI—VI in FIG. 1.
Figure 7:
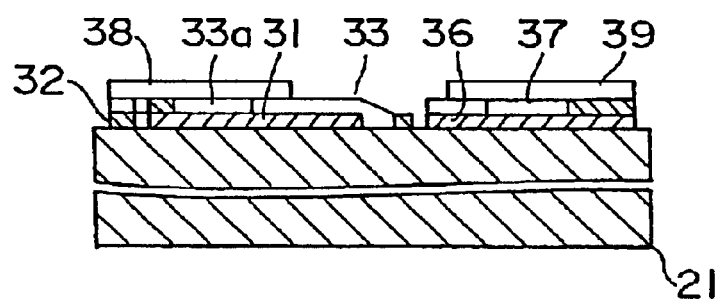
FIG. 7 is a sectional view taken along a line VII—VII in FIG. 1.
Figure 8:
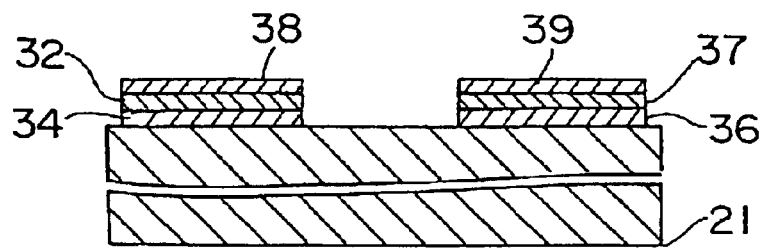
FIG. 8 is a sectional view taken along a line VIII—VIII in FIG. 1.

As shown in FIG. 4, an input connecting portion 23 having the same external shape as the first extending portion 22b and made of a thin-film metal is formed to overlap the first extending portion 22b.

Also, as shown in FIG. 1, ground (GND) connecting portions 24 and 25 having the same external shapes as the second and third extending portions 22c and 22d, respectively, and made of a thin-film metal are formed to overlap the second and third extending portions 22c and 22d, respectively.

These ground connecting portions 24 and 25 communicate with each other at the other end of the resistor 22a.

These connecting portions 23, 24, and 25 are made of a low-resistance metal film (or a plurality of stacked layers of thin films of different metals) of, e.g., platinum or gold, having a thickness of about 0.5 μm.

An input electrode 26 and ground (GND) electrodes 27 and 28, each having a wide rectangular shape, are formed on end portions 23a, 24a, and 25a of the connecting portions 23, 24, and 25, respectively, on the side 21b of the substrate 21.

These electrodes 26, 27, and 28 are made of a gold-plated layer about 5 μm thick.

The electrodes 26, 27, and 28 are connected to the two ends of the resistor 22a via the connecting portions 23, 24, and 25, respectively.

The resistance of the resistor 22c, which forms a thin-film resistor by connecting its two ends to the input connecting portion 23 and the ground connecting portions 24 and 25, is determined by the material of the thin-film member 22 and the width, length, and thickness of the resistor 22a.

In this embodiment, the area of the resistor 22a is decreased so that heat generating portions of the power detecting element 20 are concentrated into one point in the center of the substrate 21, and that the resistor 22a is a pure resistor up to a RF region. Also, the dimensions of individual portions are so set that the resistance is 50Ω (or 75Ω) which is equal to the transmission impedance of a RF coaxial cable.

In contrast to this small resistor 22a, the input electrode 26 and the ground electrodes 27 and 28 are so formed as to have large areas in order to ensure the easiness of packaging.

The connecting portions 23, 24, and 25 connecting with the input electrode 26 and the ground electrodes 27 and 28 widen toward the side 21b of the substrate 21 and communicate with the electrodes 26, 27, and 28.

Additionally, to form a coplanar transmission line from the input electrode 26 and the ground electrodes 27 and 28 to the two ends of the resistor 22c, the ratio of the width Wa of the input connecting portion 23 and the input electrode 26 to the gap Ga between the ground connecting portions 24 and 25 and the ground electrodes 27 and 28 is held substantially constant. Consequently, the impedance viewed from the input terminal is substantially equal to the resistance of the resistor 22a.

Note that letting W be the width of a central conductor and G be the gap between the central conductor and a ground conductor, the transmission impedance of a coplanar transmission line is determined substantially in accordance with the value of (W+G)/W and the line length.

Theoretically, as in the case of a module substrate 43 to be described later, it is necessary to nonlinearly change the width of the central conductor in accordance with the length of the transmission line.

In this power detecting element 20, however, the transmission line length is short. Therefore, the width of the input connecting portion 23 and the gap between the ground connecting portions 24 and 25 are linearly increased, and the ratio of the width Wa to the gap Ga is fixed.

With the above arrangement, the frequency characteristic of this power detecting element 20 broadens to 65 GHz or more, which is twice the aforesaid conventional frequency or more.

Two thermocouples 30 and 35 are formed on a side 21e of the substrate 21 away from the resistor 22a with the ground connecting portions 24 and 25 between them.

The thermocouple 30 has a thin-film member 31 formed into a substantially rectangular shape long from end to end on one surface 21a of the substrate 21.

The thermocouple 35 has a thin-film member 36 formed into a substantially rectangular shape long from side to side on one surface 21a of the substrate 21.

These thin-film members 31 and 36 are made of a micro-crystalline silicon germanium thin film having the same thickness as the thin-film member 22 forming the resistor 22a.

As shown in FIG. 3, corners 31a and 36a of the thin-film members 31 and 36 are close to the resistor 22a, and diagonal corners 31b and 36b are far from the resistor 22a.

As shown in FIG. 1, one end 32a of a first output connecting portion 32 is connected to overlap the corner 31a of the thin-film member 31.

This connecting portion is a hot junction of the thermocouple 30.

The first output connecting portion 32 so runs as to surround the perimeter of the thin-film member 31.

The other end 32b of this first output connecting portion 32 forms a cold junction of the thermocouple 30 and runs to the corner between the two sides 21c and 21e of the substrate 21.

One end 33a of an intermediate connecting portion 33 is connected to overlap the corner 31b of the thin-film member 31 in wide area.

This connecting portion forms a cold junction of the thermocouples 30 and 35.

The other end 33b of the intermediate connecting portion 33 is connected to overlap the corner 36a of the thin-film member 36.

This connecting portion forms a hot junction of the thermocouple 35.

A second output connecting portion 37 serving as a cold junction of the thermocouple 36 is connected to overlap the corner 36b of the thin-film member 36.

The first and second output connecting portions 32 and 37 and the intermediate connecting portion 33 are made of a low-resistance metal thin film, similar to the input connecting portion 23 and the ground connecting portions 24 and 25.

On the surfaces of the first and second output connecting portions 32 and 37 close to the side 21e of the substrate 21, output electrodes 38 and 39 having a rectangular shape long from end to end and made of a gold-plated layer about 5 μm thick are formed at the same level as the input electrode 26 and the ground electrodes 27 and 28.

Between the other end 32b of the first output connecting portion 32 and the upper surface of the substrate 21, a thin-film member 34 made from micro-crystalline silicon germanium is formed into a rectangular shape long from end to end, in order to level the surface of the end 32b of the first output connecting portion 32 with the surface of the second output connecting portion 37.

Figure 9:
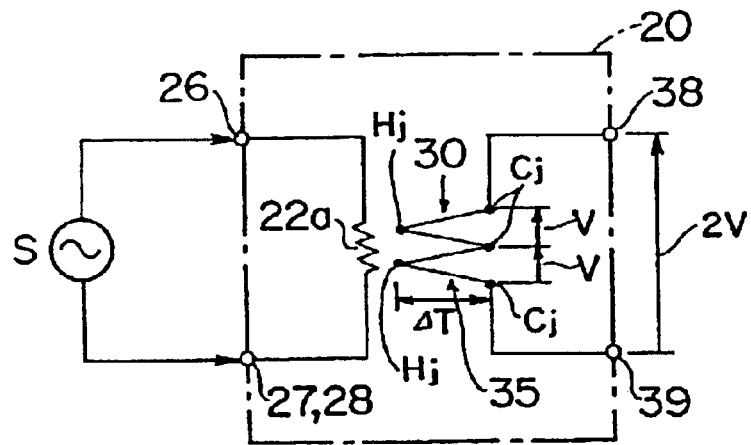
FIG. 9 is an equivalent circuit diagram of the wide-band RF signal power detecting element according to the first embodiment of the present invention.

In the power detecting element 20 constructed as above, as shown in an equivalent circuit diagram of FIG. 9, when a signal S to be measured is supplied to the input electrode 26 and the ground electrodes 27 and 28 connected to the two ends of the resistor 22b, the resistor 22b generates heat in accordance with the power of the signal S.

This heat raises the temperature at a hot junction Hj of the two thermocouples 30 and 35. Consequently, these two thermocouples 30 and 35 generate electromotive forces V directly proportional to a temperature difference ΔT between the hot junction Hj and a cold junction Cj.

An output of 2 V obtained by adding the electromotive forces V of the two thermocouples 30 and 35 is output from the output terminals 38 and 39.

Note that the micro-crystalline silicon germanium forming the thin-film members 22, 31, 34, and 36 has a Seebeck coefficient, which represents the magnitude of electromotive force corresponding to the temperature difference between a hot junction and a cold junction, of 100 to 200 $\mu$V/K.

This value is about an order of magnitude larger than those of conventional metal thin-film materials.

In addition, the micro-crystalline silicon germanium forming the thin-film members 22, 31, 34, and 36 has dependence of conductivity on temperature far smaller than those of other micro-crystalline semiconductor thin films. Therefore, as described above, this micro-crystalline silicon germanium can be used as the resistor 22a for converting a signal into heat and as one thermocouple material of each of the two thermocouples 30 and 35.

Furthermore, the micro-crystalline silicon germanium is stable at a high temperature of 600° C. and hence is immune to burning out even when large power to be measured is supplied to the resistor 22a.

Steps of manufacturing this power detecting element 20 are as described in (a) to (d) below.

(a) A sapphire substrate (or a glass substrate, a fused quartz substrate, or the like) having a size by which a plurality of power detecting elements 20 can be formed is cleaned. After that, a micro-crystalline silicon germanium thin film is deposited on one entire surface of this substrate by plasma CVD (Chemical Vapor Deposition).

(b) Thin-film members 22, 31, 34, and 36 corresponding to a plurality of elements are formed by patterning by using photoetching.

(c) A thin metal film is deposited on these thin-film members 22, 31, 34, and 36 by using vacuum vapor deposition or sputtering. After that, connecting portions corresponding to a plurality of elements are formed by using photoetching.

(d) A gold-plated layer is formed on these connecting portions to form electrodes, and the power detecting elements 20 are cut out by a dicer or the like.

In the first embodiment of the present invention as described above, the resistor 22a and one thermocouple material of each thermocouple are formed by the same micro-crystalline silicon germanium thin film. Additionally, the connecting portions and electrodes formed on this micro-crystalline silicon germanium thin film are formed by the same metal thin film, resulting in simple manufacturing steps. Accordingly, it is possible to inexpensively manufacture the power detecting elements 20 for wide-band RF signals, which have high yield and uniform characteristics.

Figure 10:
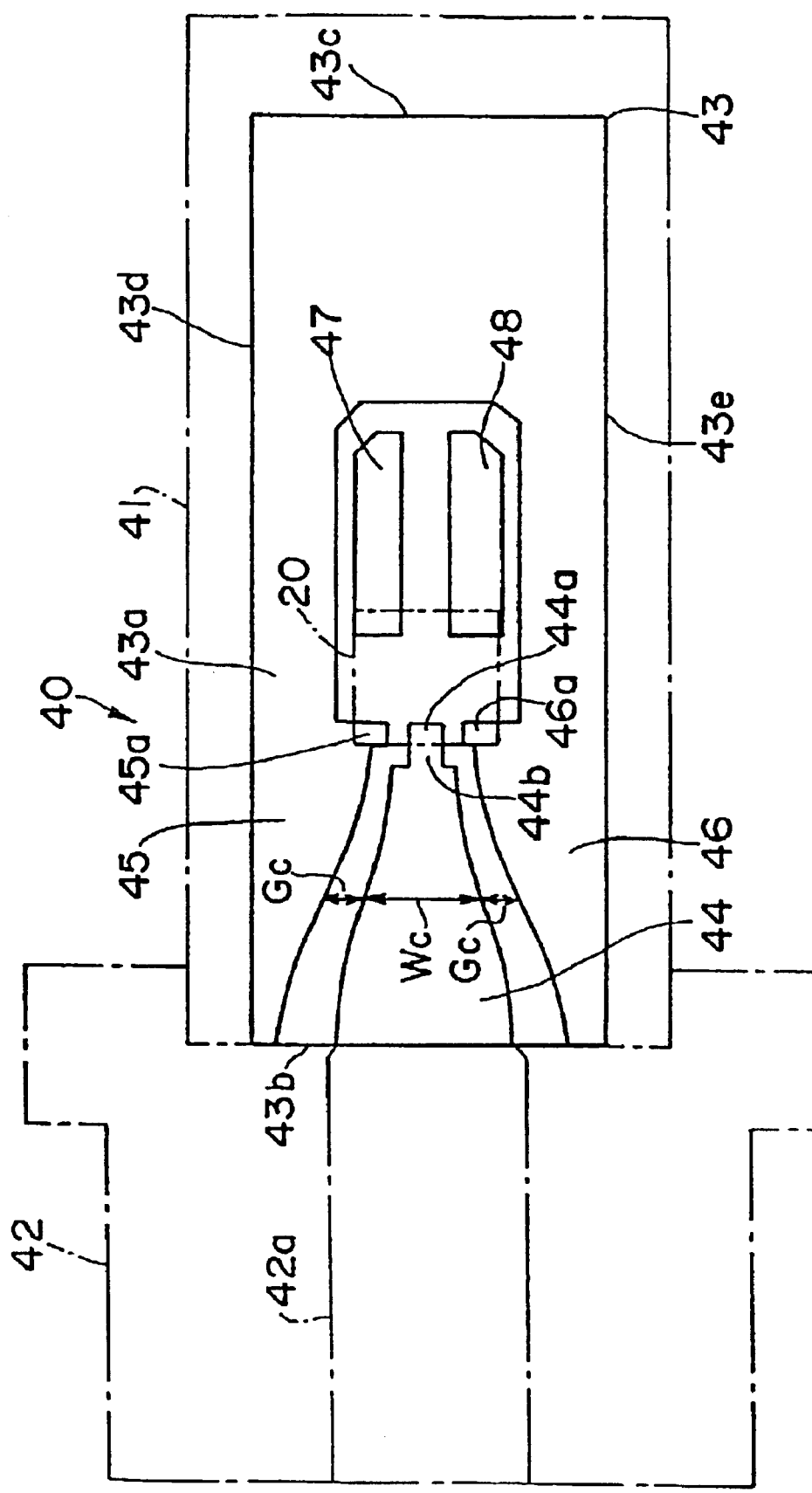
FIG. 10 is a schematic plan view showing a power detecting device using the wide-band RF signal power detecting element according to the first embodiment of the present invention.

The power detecting element 20 manufactured in this way is incorporated, as it is mounted on a module substrate 43, into a case 41 of a power detecting device 40, as shown in FIG. 10.

This case 41 is made of a metal in order to thermally shield the exterior and the interior, and is formed into, e.g., a cylindrical shape. A coaxial connector 42 for connecting a coaxial cable (not shown) is formed in one end of this case 41.

The module substrate 43 guides a signal to be measured input from the coaxial connector 42 to the power detecting element 20 and externally outputs an output signal from the power detecting element 20.

This module substrate 43 has the shape of a rectangle. A central conductor 44 is formed by patterning from an end 43b to an end 43c of a surface 43a of the module substrate 43.

This central conductor 44 connects a core 42a of the coaxial connector 42 to the input electrode 26 of the power detecting element 20.

That is, the central conductor 44 is so formed as to decrease its thickness in a direction from the end 43b to the end 43c of the module substrate 43.

Figure 11:
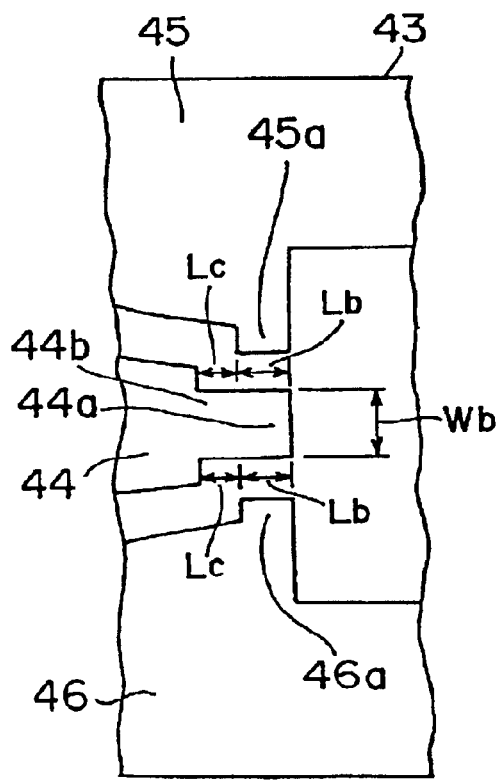
FIG. 11 is an enlarged view of the main components in FIG. 10.

As shown in FIG. 11, a mount portion 44a having a width Wb and a length Lb, substantially equal to those of the input electrode 26 of the power detecting element 20, is formed at the end portion of the central conductor 44.

This mount portion 44a has an elongated portion 44b which is elongated, with the same width Wb, by a predetermined distance Lc toward one end 40b of the module substrate 43.

Ground (GND) conductors 45 and 46 are formed on the two sides of the central conductor 44 by patterning.

These ground conductors 45 and 46 form a coplanar transmission line together with the central conductor 44. To be equal to the transmission impedance (the resistance of the resistor 22a of the power detecting element 20) of the coaxial cable, the ratio of a width Wc of the central conductor 44 to a gap Gc from the central conductor 44 to the ground conductors 45 and 46 is held substantially constant.

These portions of the ground conductors 45 and 46 that are on the two sides of the mount portion 44a of the central conductor 44 have rectangular mount portions 45a and 46a, respectively, matching the ground (GND) electrodes 27 and 28 of the power detecting elements 20.

These ground conductors 45 and 46 connect with each other in the rear portion of the module substrate 43 and are in contact with the case 41 in two side portions 43d and 43e of the module substrate 43.

The elongated portion 44b of the central conductor 44 prevents disturbance of the impedance, caused by an increase in the capacitance between the junction portion of the input electrode 26 of the power detecting element 20 and the mount portion 44a and the junction portions of the ground electrodes 27 and 28 of the power detecting element 20 and the mount portions 45a and 46a, when the power detecting element 20 is mounted on the module substrate 43.

That is, the ratio of the width Wc of the central conductor 44 to the gap Gc between the central conductor 44 and the ground conductors 45 and 46 is changed (made smaller than the width determined by the ratio) only in this portion. This gives the central conductor 44 inductance corresponding to the capacitance increase, thereby preventing disturbance to the impedance resulting from the capacitance increase.

In a central portion of the module substrate 43, a pair of output conductors 47 and 48 are formed parallel by patterning.

The spacing and width of these output conductors 47 and 48 are substantially equal to the spacing and width of the output electrodes 38 and 39 of the power detecting element 20.

The power detecting element 20 is soldered to the module substrate 43 constructed as above, with the surface 21a of the substrate 21 facing the surface 43a of the module substrate 43, the input electrode 26 and the ground electrodes 27 and 28 overlapping the mount portions 44a, 45a, and 46a of the module substrate 43, and the output electrodes 38 and 39 overlapping the output conductors 47 and 48.

Although not shown, an amplifier (e.g., a chopper amplifier) for amplifying output signals from the output conductors 47 and 48 is formed at the end 43c of the module substrate 43.

That is, a series output of the electromotive forces of the two thermocouples is amplified by this amplifier and output to the outside of the case 41. An indicator or the like indicates the power of this signal.

Figure 12:
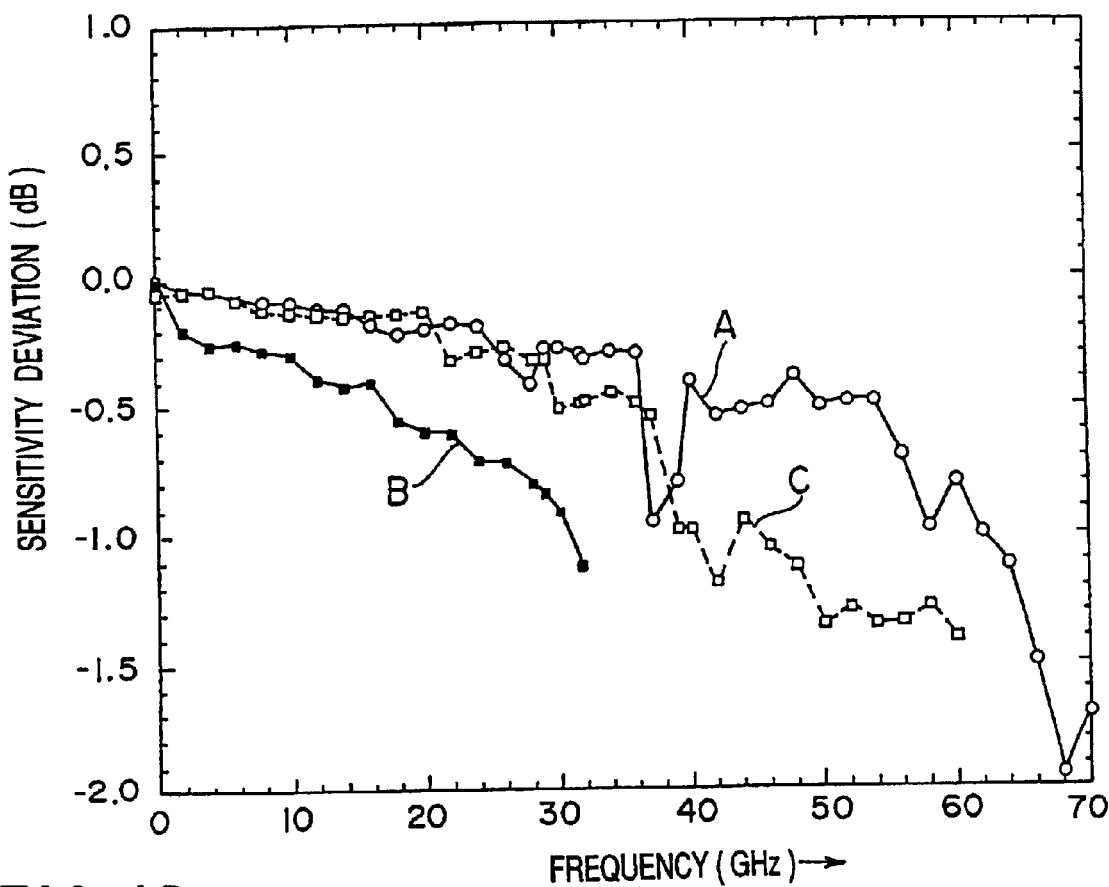
FIG. 12 is a graph showing the frequency characteristics of the power detecting device using wide-band RF signal power detecting element according to the first embodiment of the present invention.

FIG. 12 shows the measurement results of the frequency vs. sensitivity characteristics of this power detecting device 40 and the conventional device described previously.

A curve A in FIG. 12 indicates the characteristic of the power detecting device 40 with reference to the output when direct current is input.

A curve B in FIG. 12 indicates the characteristic of the conventional device.

It is evident from FIG. 12 that in the conventional device the upper limit of the frequency range within which the sensitivity lowers by 1 dB is 32 GHz, whereas the frequency range of the power detecting device 40 of this embodiment widens from DC to 65 GHz, i.e., has a characteristic twice as broad as that of the conventional device or more.

A curve C in FIG. 12 indicates the characteristic when the central conductor 44 of the module substrate 43 has no elongated portion 44b.

If this is the case, the sensitivity lowers by 1 dB at substantially 40 GHz.

This demonstrates that the characteristics of the power detecting element 20 can be well brought out by the formation of this elongated portion 44b.

Figure 13:
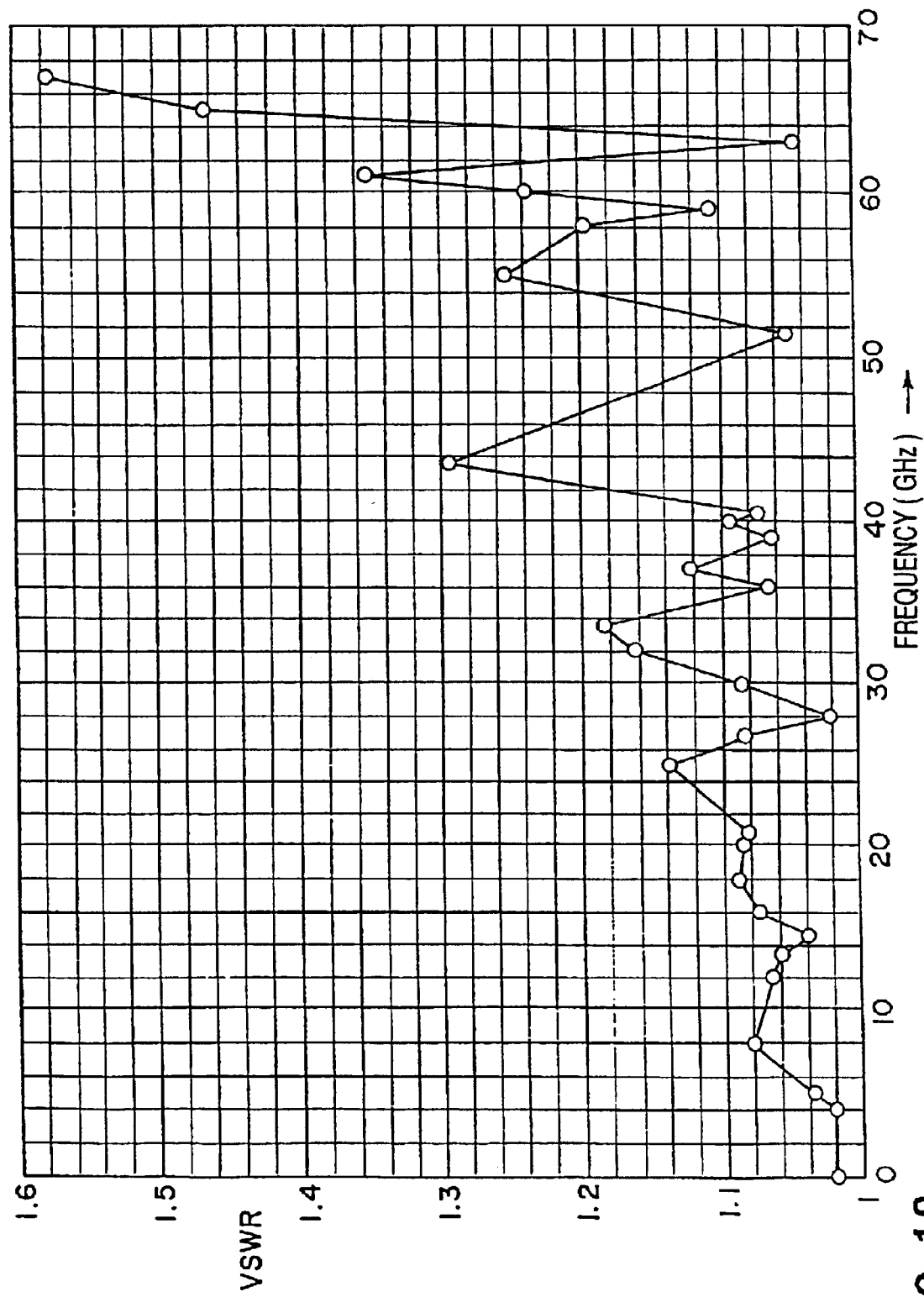
FIG. 13 is a graph showing the frequency characteristic of the power detecting device using wide-band RF signal power detecting element according to the first embodiment of the present invention.

FIG. 13 shows the measurement result of the frequency-to-voltage standing wave ratio of the power detecting device 40.

The characteristic shown in FIG. 13 is in good agreement with the characteristic A shown in FIG. 12.

Accordingly, these characteristics show that the SWR (Standing Wave Ratio) of the power detecting device 40 of this embodiment is decreased to 1.5 or less from DC to 65 GHz, so this power detecting device 40 can accurately detect power, over this wide band, without being largely influenced by reflecting waves.

Second Embodiment

In the above first embodiment, one thin-film resistor-absorbs the power of a signal to be measured. However, a plurality of thin-film transistors can also absorb the power of a signal to be measured.

Figure 14:
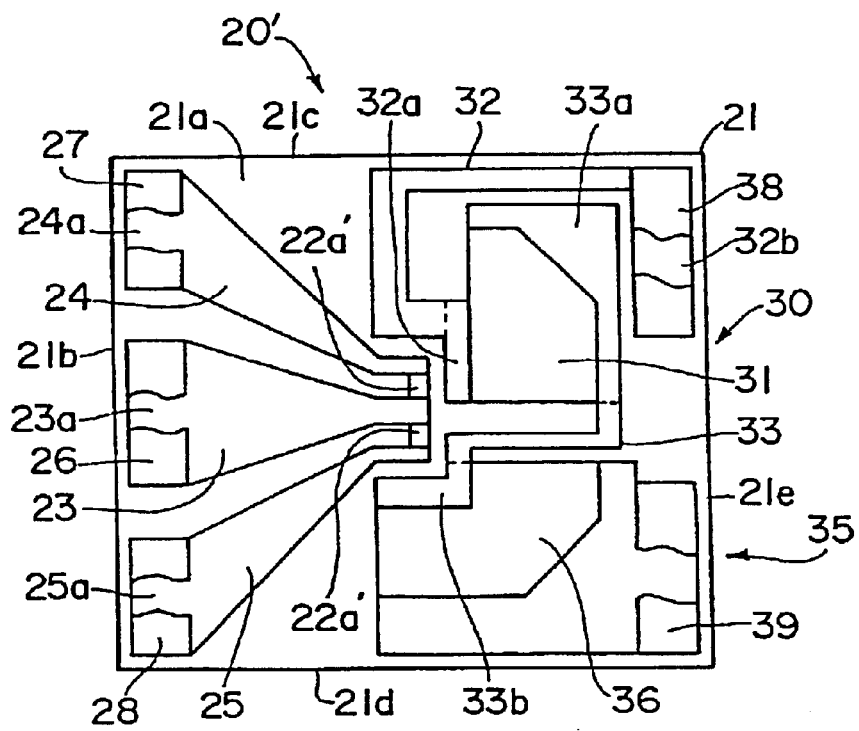
FIG. 14 is a plan view showing a wide-band RF signal power detecting element according to the second embodiment of the present invention.

For example, as the second embodiment, a power detecting element 20' shown in FIG. 14 has two thin-film transistors 22a' and 22a' on a substrate 21.

One end of each of these two thin-film transistors 22a' and 22a' is connected to an input connecting portion 23.

The other end of one thin-film transistor 22a' is connected to the distal end of a ground connecting portion 24.

The other end of the other thin-film resistor 22a' is connected to the distal end of a ground connecting portion 25.

In this structure, by setting the resistance of each thin-film resistor 22a' to be substantially twice that of the resistor 22a in the first embodiment, this resistance can be matched with the transmission impedance viewed from an input electrode 26 and ground electrodes 27 and 28.

The ends of the ground connecting portions can also be connected to each other on the substrate 21.

The number of thin-film resistors is not limited to two and can be further increased.

Since a plurality of thin-film resistors are formed as described above, the power of a signal to be measured is divisionally absorbed by these resistors. This disperses the heat generation, increases the burnout level of each resistor, and improves the heat resistance.

Note that input resistors are separated from thermocouples, so the pattern of these input resistors can be formed independently of the thermocouples. Accordingly, even if the number of thin-film transistors is increased, the frequency characteristic does not deteriorate.

Third Embodiment

The power detecting element 20 of the first embodiment has two thermocouples. However, only one thermocouple can also be used if the sensitivity is of no great importance.

If, however, the sensitivity is of great importance, the sensitivity of the power detecting element 20 of the first embodiment can be further increased by using three thermocouples.

FIGS. 15 to 19 show a power detecting element 50 having seven thermocouples according to this third embodiment.

Figure 17:
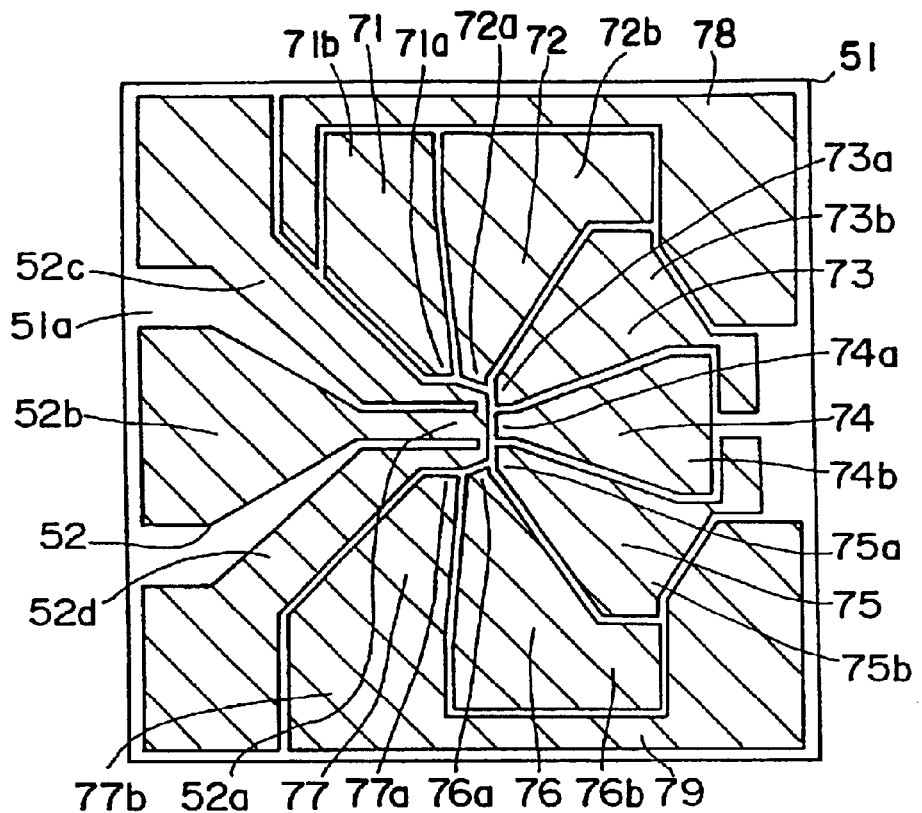
FIG. 17 is a sectional view taken along a line XVII—XVII in FIG. 16.

In this power detecting element 50, as shown in FIG. 17, on one surface 51a of an insulating rectangular substrate 51, a resistor 52a and first, second, and third extending portions 52b, 52c, and 52d are formed by a thin-film member 52 made from micro-crystalline silicon germanium.

An input connecting portion 53 is formed to overlap the first extending portion 52b.

Ground (GND) connecting portions 54 and 55 are formed to overlap the second and third extending portions 52c and 52d, respectively.

The input connecting portion 53 is so formed as to widen toward a side 51b of the substrate 51. An input electrode 56 made of a gold-plated layer is formed in an end portion 53a of this input connecting portion 53.

The ground connecting portions 54 and 55 communicate with each other at the other end of the resistor 52a. These ground connecting portions 54 and 55 run to the corner between the side 51b and a side 51c of the substrate 51 and to the corner between the side 51b and a side 51d, respectively.

Ground electrodes 57 and 58 made of a gold-plated layer are formed in end portions 54a and 55a of the ground connecting portions 54 and 55, respectively.

As in the power detecting element 20 of the first embodiment, the input connecting portion 53 and the input electrode 56, and the ground connecting portions 54 and 55 and the ground electrodes 57 and 58, are formed so that the ratio of the width of the input connecting portion 53 and the input electrode 56 to the gap between the ground connecting portions 54 and 55 and the ground electrodes 57 and 58 is held substantially constant, and so as to form a coplanar transmission line having transmission impedance substantially equal to the resistance of the resistor 52a.

Figure 15:
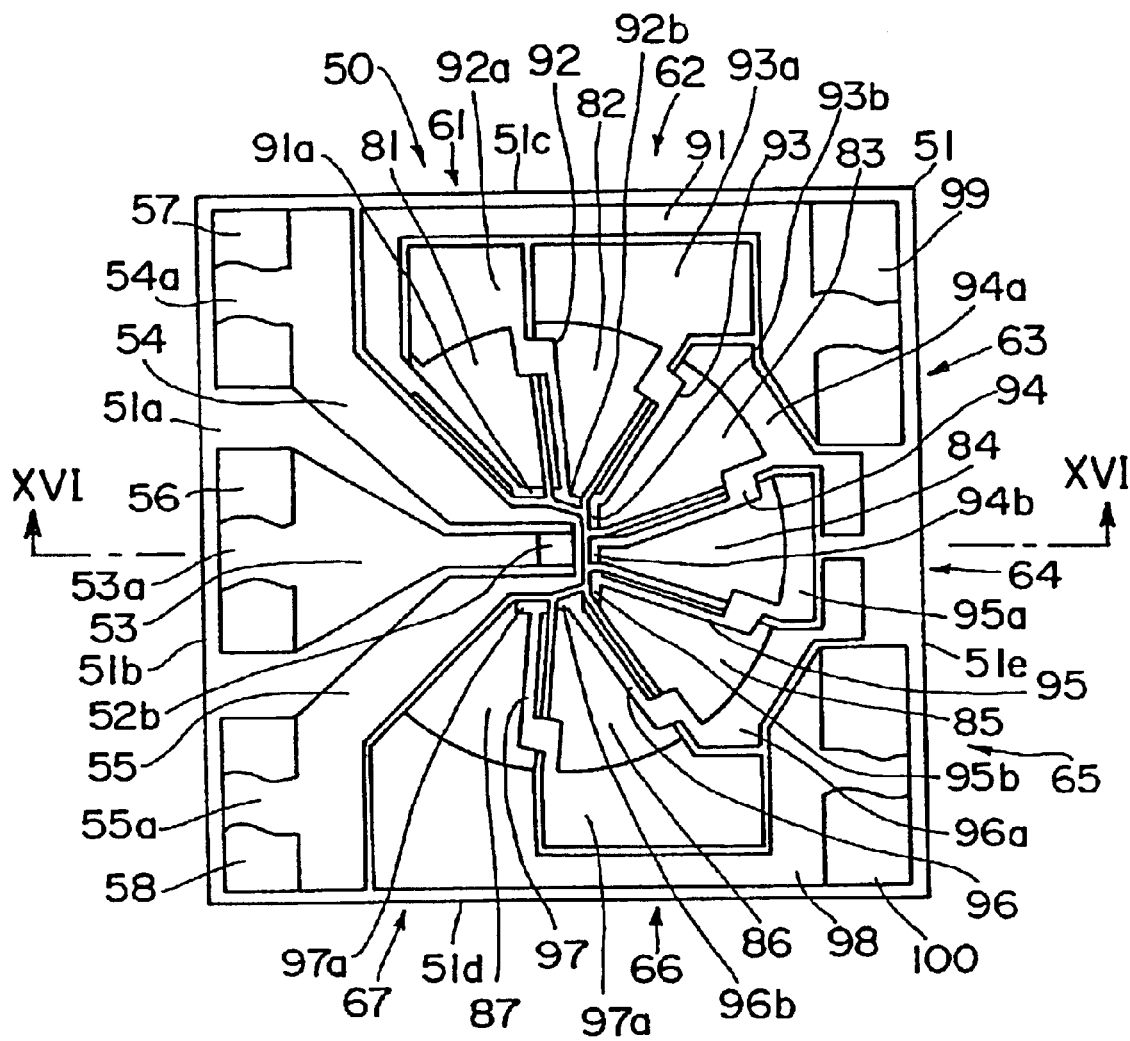
FIG. 15 is a side view showing the wide-band RF signal power detecting element according to the second embodiment of the present invention.
Figure 16:
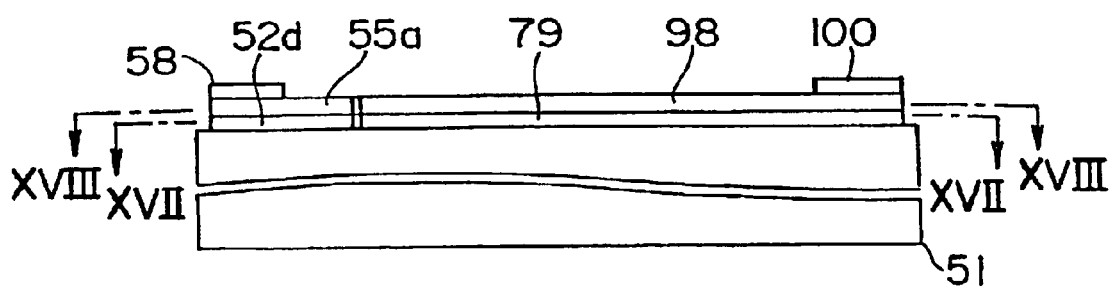
FIG. 16 is a sectional view taken along a line XVI—XVI in FIG. 15.

On the surface of the substrate 51 away from the ground connecting portions 54 and 55 with the resistor 52a between them, seven thermocouples 61 to 67 radially arrayed as shown in FIG. 15 are formed.

As shown in FIG. 17, these thermocouples 61 to 67 have substantially fan-shaped thin-film members 71 to 77, respectively, which divide the range from the ground connecting portions 54 and 55 to a side 51e of the substrate 51 into seven segments.

Figure 18:
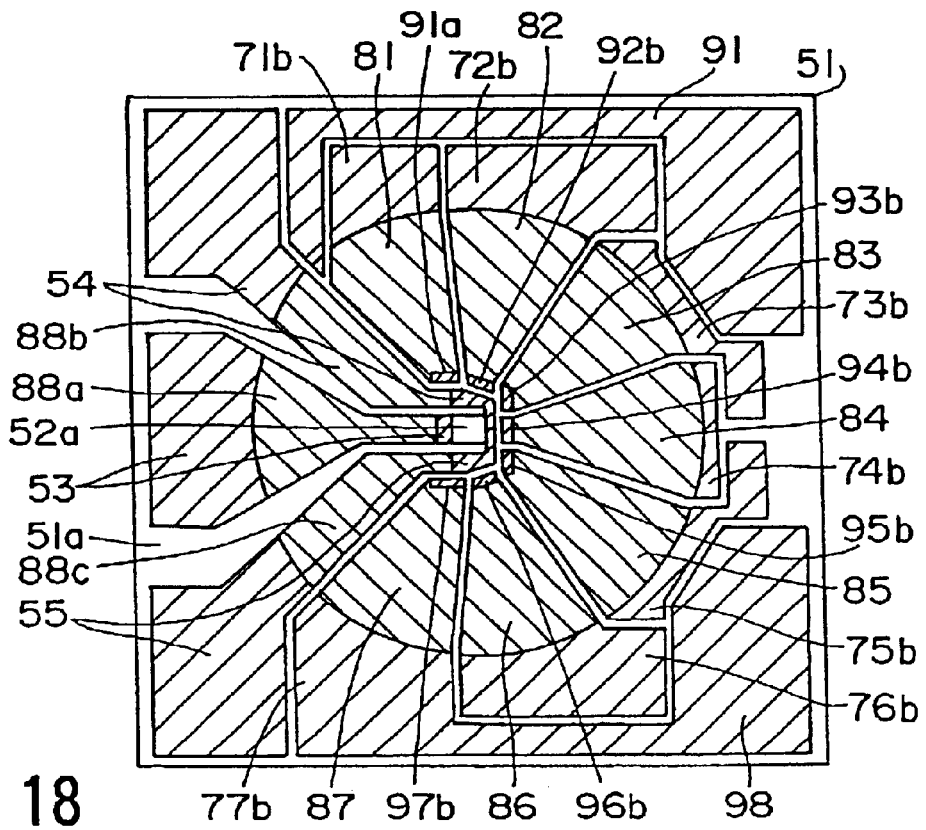
FIG. 18 is a sectional view taken along a line XVIII—XVIII in FIG. 16.
Figure 19:
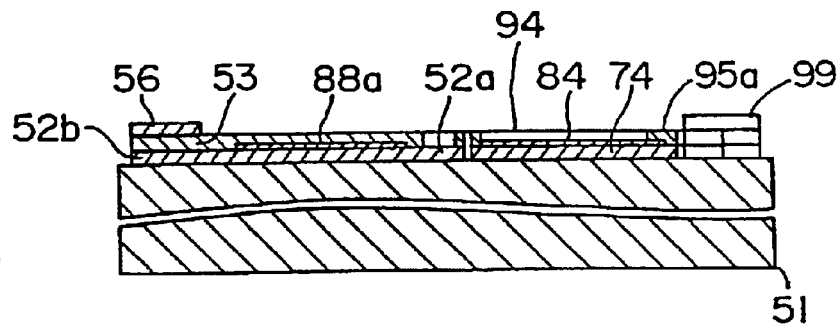
FIG. 19 is a plan view showing a wide-band RF signal power detecting element according to the third embodiment of the present invention.
Figure 20:
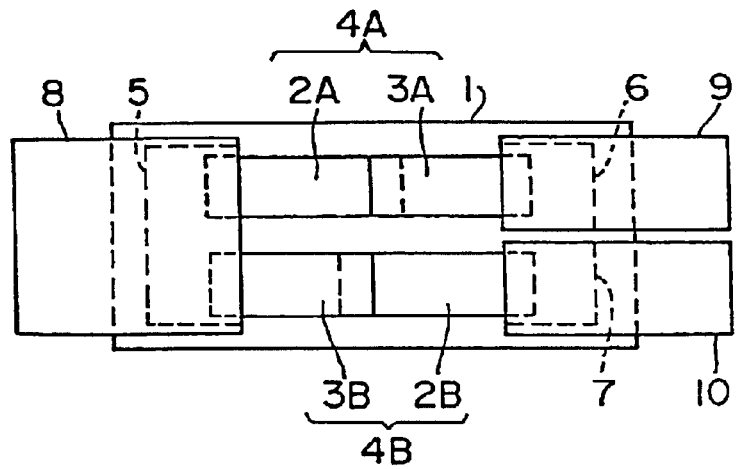
FIG. 20 is a plan view showing a conventional power detecting element.
Figure 21:
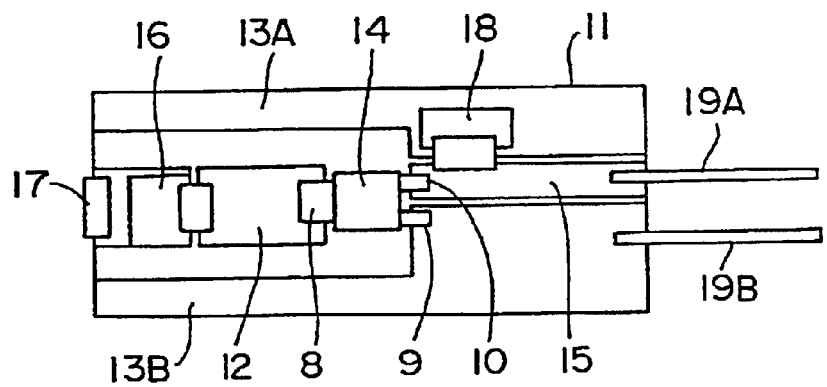
FIG. 21 is a plan view showing a conventional power detecting device.
Figure 22:
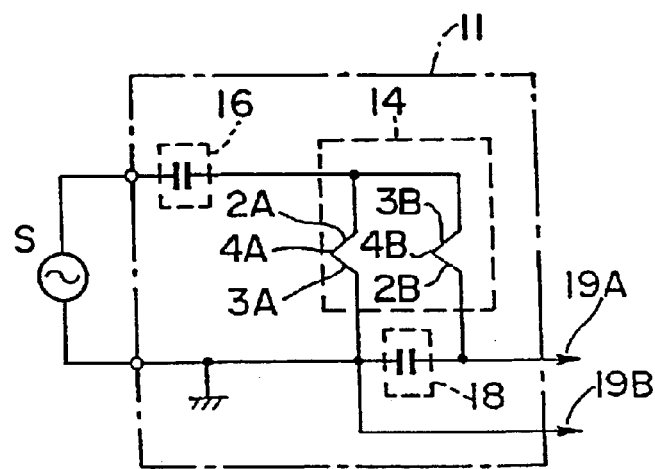
FIG. 22 is an equivalent circuit diagram of the conventional power detecting device.

These thin-film members 71 to 77 are made from micro-crystalline silicon germanium. As shown in FIG. 18, on the surfaces of these thin-film members 71 to 77, insulating films 81 to 87 are formed except for distal end portions 71a to 77a close to the resistor 52a and outer edge portions 71b to 77b outside a circle of a predetermined radius centering around the resistor 52a.

A thin-film member 78 for receiving one output electrode is formed between the perimeter of the thin-film member 71 adjacent to the ground connecting portion 54 and the corner between the two sides 51c and 51e of the substrate 51.

A thin-film member 79 for receiving the other output electrode runs between the outer edge of the thin-film member 77 adjacent to the ground connecting portion 55 and the corner between the two sides 51d and 51e of the substrate 51.

Insulating films 88a to 88c are formed between intermediate portions, between the input connecting portion 53 and the ground connecting portions 54 and 55, and the thin-film member 52.

One end 91a of an output connecting portion 91 is connected to the distal end portion 71a of the thin-film member 71, adjacent to the ground connecting portion 54, so as to overlap this end portion 71a.

This connecting portion forms a hot junction of the thermocouple 61.

The output connecting portion 91 extends from the distal end portion 71a of the thin-film member 71 to the corner between the two sides 51c and 51e of the substrate 51, over the insulating film 81, so as to overlap the thin-film member 78.

One end 92a of an intermediate connecting portion 92 is connected to overlap the outer edge portion 71b of the thin-film member 71 in wide area.

This intermediate connecting portion 92 runs from the outer edge portion 71b of the thin-film member 71 to the distal end portion 72a of the thin-film member 72, over the insulating film 81 and the insulating film 82 of the adjacent thin-film member 72. The other end 92b of the intermediate connecting portion 92 is connected to the distal end portion 72a of the thin-film member 72.

In a similar fashion, portions between the thin-film members 72 to 77 are connected via intermediate connecting portions 93 to 97, respectively.

The outer edge portion 77b of the thin-film member 77 is connected to an output connecting portion 98 so formed as to overlap the thin-film member 79.

Output electrodes 99 and 100 made of a gold-plated layer are formed at the same level in the end portions of the output connecting portions 91 and 97.

In the power detecting element 50 constructed as above, the sum of the electromotive forces of the seven thermocouples 61 to 67 is output between the output electrodes 99 and 100.

In this power detecting element 50, as described above, the input electrode 56, the ground electrodes 57 and 58, and the resistor 52a are connected by the coplanar transmission line so that the transmission impedance is substantially equal to the resistance of the resistor 52a.

Accordingly, this power detecting element 50 has a frequency characteristic exceeding 65 GHz, like the power detecting element 20 of the first embodiment.

In a power detecting device in which this power detecting element 50 is mounted on a module substrate 43 described previously, therefore, electromotive force larger than that of the power detecting device 40 of the first embodiment can be obtained. This makes detection of micro watt power possible.

In the above embodiment, the input connecting portion and the ground connecting portions overlap in a broad range of the thin-film member forming the resistor. However, it is also possible to form a thin-film member as a resistor only in a limited range on one surface of a substrate and form connecting portions so that their end portions overlap the two ends of this resistor, thereby connecting these connecting portions to an input electrode and ground electrodes.

Also, in the module substrate 43 in the above embodiment, to cancel any capacitance increase caused by junctions between input and ground electrodes of a power detecting element 20 and the mount portions, an elongated portion 44b narrower than a predetermined width determined by the transmission impedance is formed to connect with the mount portion of a central conductor 44, thereby increasing the inductance in accordance with the capacitance increase.

The present invention, however, is not limited to this embodiment. For example, the inductance corresponding to the capacitance increase can also be formed in a position separated from the mount portion of the central conductor 44.

Furthermore, while the width of the central conductor 44 is set, over its whole length, to a predetermined width determined by the transmission impedance, a notch or the like is formed in a ground conductor 45 so as to partially widen the gap between the central conductor 44 and the ground conductor 45. In this manner, the central conductor 44 can be given an inductance corresponding to the capacitance increase caused by mounting of the power detecting element.

Fourth Embodiment

Figure 23A:
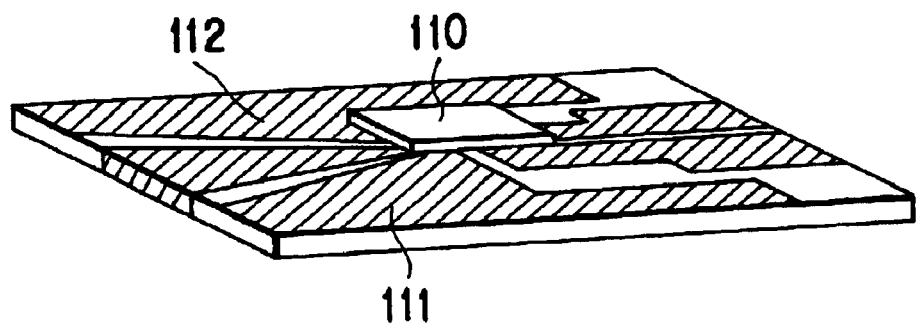
FIG. 23A is a perspective view showing a module substrate 111 on which a wide-band RF signal power detecting element (power sensor element) 110 according to the fourth embodiment of the present invention is mounted.
Figure 23B:
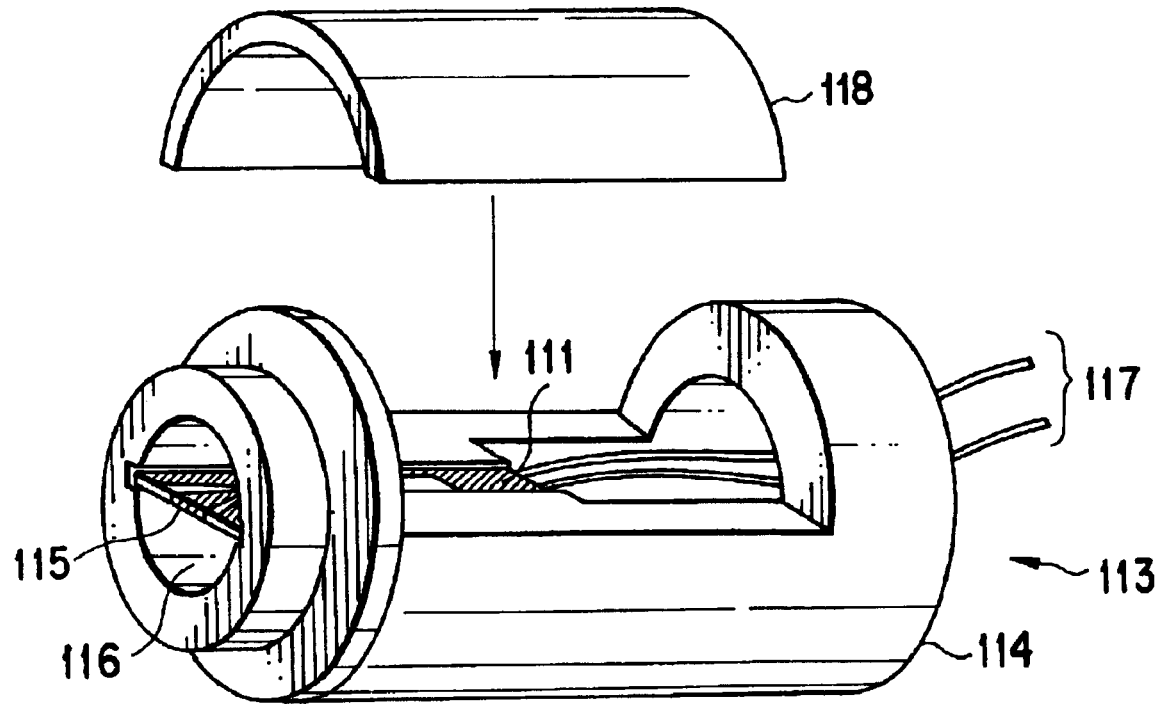
FIG. 23B is a perspective view showing a coaxial type wide-band RF signal power detecting device (coaxial power sensor) containing the module substrate 111 according to the fourth embodiment of the present invention.

FIGS. 23A and 23B show a coaxial type wide-band RF signal power detecting device (coaxial power sensor) according to the fourth embodiment of the present invention.

That is, a module substrate 111 on which, as shown in FIG. 23A, a wide-band RF signal power detecting element (power sensor element) 110, formed in the same manner as in the first to third embodiments described above, is mounted is incorporated, as shown in FIG. 23B, into a coaxial module tube 114 as a coaxial case, thereby realizing a coaxial type wide-band RF signal power detecting device (coaxial power sensor) 113.

Reference numeral 112 in FIG. 23A denotes solder for cementing used to mount the power detecting element (power sensor element) 110 on the module substrate 111.

Reference numeral 115 in FIG. 23B denotes a contact portion that projects into the front end portion of the coaxial module tube 114 as a coaxial case incorporating the module substrate 111.

Reference numeral 116 in FIG. 23B denotes a hollow portion (absorber) of the coaxial module tube 114 as a coaxial case incorporating the module substrate 111.

Reference numeral 117 in FIG. 23B denotes a lead line that projects from the rear end portion of the coaxial module tube 114 as a coaxial case incorporating the module substrate 111.

Reference numeral 118 in FIG. 23B denotes a cover attached to the coaxial module tube 114 as a coaxial case incorporating the module substrate 111.

That is, as shown in FIGS. 23A and 23B, this coaxial power sensor 113 comprises the coaxial module tube 114 which transmits a RF signal supplied, via a coaxial cable (not shown), from a RF signal source to the contact portion 115, which projects into the front end portion of the coaxial module tube 114, of the module substrate 111, the module substrate 111 formed inside this coaxial module tube 114, and the power sensor element 110 formed on this module substrate 111.

In this construction, a RF signal to be measured supplied from the coaxial cable (not shown) is transmitted to the module substrate 111 via the contact portion 115 for matching conversion to a microstrip line of a coplanar structure.

In this module substrate 111, the RF signal to be measured is converted from a coaxial-mode electromagnetic wave, propagating in the coaxial cable, into a coplanar-mode electromagnetic wave.

The coplanar-mode RF signal thus converted propagates in the vicinity of the surface of a dielectric material sandwiched between a signal line of a central conductor, as a microstrip line, on the module substrate 111 and an external ground conductor. After that, this RF signal is absorbed by the resistor of the power sensor element 110 mounted on the module substrate 111 and thereby converted into heat.

The magnitude of the generation of heat by this conversion is directly proportional to the magnitude of the power of the supplied RF signal to be measured.

The magnitude of the heat generation is converted into DC voltage by using a thermocouple placed close to the resistor of the power sensor element 110.

This DC voltage is supplied to a dedicated meter (not shown) via the lead line 117, and the magnitude of the voltage is displayed.

The contact portion 115 is formed on a surface in the center of the module substrate 111 and perpendicular to the longitudinal direction of the module substrate 111.

This contact portion 115 is desirably made of a thin-film piece, which has high electrical conductivity and is soft, such as a gold ribbon, in order to improve the contact with a coaxial cable terminal (not shown).

Also, the material of the coaxial module tube 114 is desirably, e.g., copper or brass, having high electrical conductivity.

To decrease the cost of the coaxial module tube 114, it is also effective to use plastic having a small linear expansion coefficient as a base material and to cover the surface with plating of an electrically, thermally conductive material, such as gold or nickel.

As the coplanar module substrate 111, sapphire or aluminum having a large dielectric constant and a small dielectric loss is used.

As a method of mounting the power sensor element 110 on this module substrate 111, a solder fusing method which uses the solder 112 to mount the power detecting element (power sensor element) 110 on the module substrate 111 as described earlier is used.

To absorb electromagnetic waves leaking outside the surface of the module substrate 111, the hollow portion 116 of the coaxial module tube 114 is desirably filled with an electromagnetic wave absorber, such as polyiron, in order to increase the measurement accuracy.

Fifth Embodiment

FIGS. 24 to 27 show a waveguide type wide-band RF signal power detecting element (power sensor element) and a waveguide type wide-band RF signal power detecting apparatus using the element.

Coaxial type and waveguide type elements are possible as millimeter-wave power sensor elements.

Of these elements, a coaxial type power detecting element (power sensor element) and a coaxial type power detecting device using the same is realized in each of the first to fourth embodiments described above.

A waveguide type power detecting element (power sensor element) and a waveguide type power detecting device using the same can be realized by this fifth embodiment.

Figure 24:
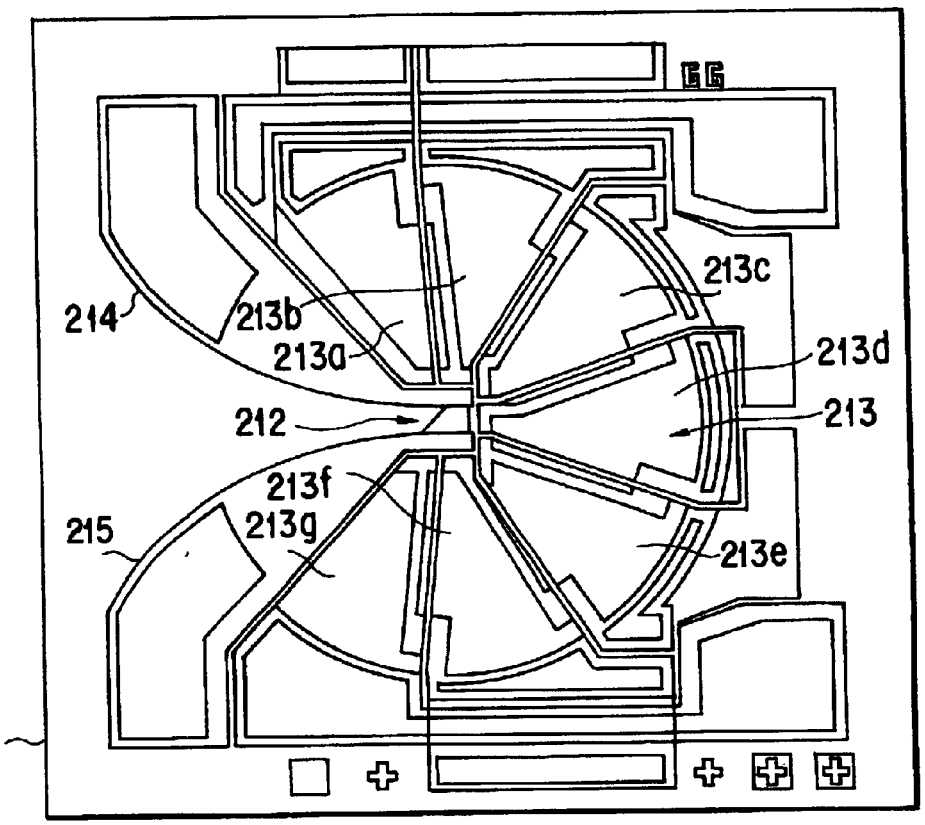
FIG. 24 is a plan view showing the structure of a waveguide type wide-band RF signal power detecting element (power sensor element) according to the fifth embodiment of the present invention.

As shown in FIG. 24, the structure of a waveguide type power detecting element (power sensor element) is basically the same as the coaxial type element except that the waveguide type element has two input terminals.

Figure 25A:
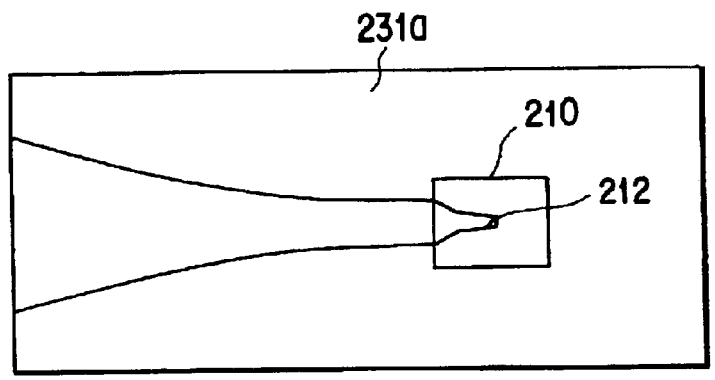
FIGS. 25A and 25B are plan views showing the structures of fin line module substrates 231a and 231b, respectively, used to match with a waveguide in the waveguide type wide-band RF signal power detecting device according to the fifth embodiment of the present invention.
Figure 25B:
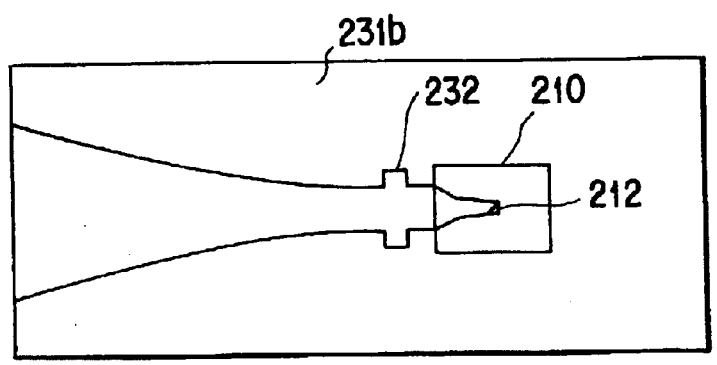

This results from the structure of fin line module substrates 231a and 231b used to match with a waveguide as shown in FIGS. 25A and 25B.

The common feature of the coaxial type and waveguide type elements is that impedance mismatching is compensated for by using a geometrical shape, thereby obtaining desired performance (FIGS. 25A and 25B).

FIG. 24 relates to the structure of a waveguide type power detecting element (power sensor element) 210 and is particularly a plan view showing an element chip.

The chip size of this element is 0.9 mm square.

In this waveguide type power detecting element (power sensor element) 210, a resistor 212 is formed in substantially the center of a 75-$\mu$m thick glass substrate 211, and thermocouples 213 are formed to surround this resistor 212, by using thin film deposition and lithography.

These thermocouples 213 include seven thermocouples 213a to 213g formed in the same manner as the seven thermocouples 61 to 67 of the power detecting element 50 according to the third embodiment shown in FIGS. 15 to 19.

This waveguide type power detecting element (power sensor element) 210 has tapered electrodes 214 and 215 to suppress reflection of incident millimeter-wave power.

The entrance opening of each taper is 0.4 mm, and its exit opening (facing the resistor 212) is 0.03 mm.

Accordingly, although the tapered electrodes 214 and 215 are formed to suppress reflection of incident millimeter-wave power, in practice a large impedance change is readily produced by this abrupt taper. In effect, large reflection having a reflectance of 0.13 takes place.

Meanwhile, to suppress reflection of incident waves to the resistor 212, the incident portion of this resistor 212 has a predetermined inclination angle (20 to 90°, desirably, 45 to 90°) to the axial line. However, reflection having a reflectance of about 0.2 still occurs.

To decrease the reflectances (RF1) of both the tapered electrodes 214 and 215 and the resistor 212, it is in principle possible to increase the length of the tapered portion or decrease the inclination angle of the resistor.

Unfortunately, neither method can be employed in the manufacture of an actual element for reasons, such as an increase in the response time, a reduction in the detectivity, and the difficulty of packaging of the element.

This is a barrier in developing millimeter-wave power sensors by the conventional method.

This embodiment, therefore, as will be described later, is characterized in that the abovementioned two reflectances (RF1) can be substantially canceled in relation to a module substrate for mounting the waveguide type power detecting element (power sensor element) 210 as shown in FIG. 24.

That is, FIGS. 25A and 25B are schematic views in which the waveguide type power detecting element (power sensor element) 210 as shown in FIG. 24 is mounted on the fin line module substrate 231a and 231b used to match with the waveguide.

The material of these fin line module substrates 231a and 231b is alumina, and their thickness is 0.05 to 0.1 mm.

The fin line module substrates 231a and 231b have fin line electrodes for exponentially changing the impedance, in order to smoothly match with the impedance of the waveguide.

In each of these fin line module substrates 231a and 231b, the entrance opening of the fin line electrode is substantially level with the waveguide, and its exit opening is 0.4 mm, meeting the taper of the waveguide type power detecting element 210.

FIG. 25A shows the fin line module substrate 231a having no recess for compensation in the fin line electrode.

FIG. 25B shows the fin line module substrate 231b having a recess for compensation in the fin line electrode.

That is, the fin line module substrate 231a or 231b shown in FIG. 25B has a recess 232 formed in a portion close to the waveguide type power detecting element (power sensor element) 210, with this waveguide type power detecting element (power sensor element) 210 mounted.

More specifically, the fin line module substrate 231a or 231b shown in FIG. 25B produces reflection with reflectance RF2 at the two end faces of the recess 232 owing to changes in the impedance, with the waveguide type power detecting element (power sensor element) 210 mounted.

By properly determining the shape and size (which determine the impedance) of the recess 232 and the distance (which determines the phase difference) between the recess 232 and the waveguide type power detecting element (power sensor element) 210, the absolute value of the reflection with the reflectance RF1 produced in the waveguide type power detecting element (power sensor element) 210 and the absolute value of the reflection with the reflectance RF2 produced in the fin line module substrate 231b can be set to be substantially equal to each other, and the phase difference can be set to 180°.

That is, the reflection with the reflectance RF1 produced in the waveguide type power detecting element (power sensor element) 210 can be canceled by the reflection with the reflectance RF2 produced in the fin line module substrate 231b.

Figure 26A:
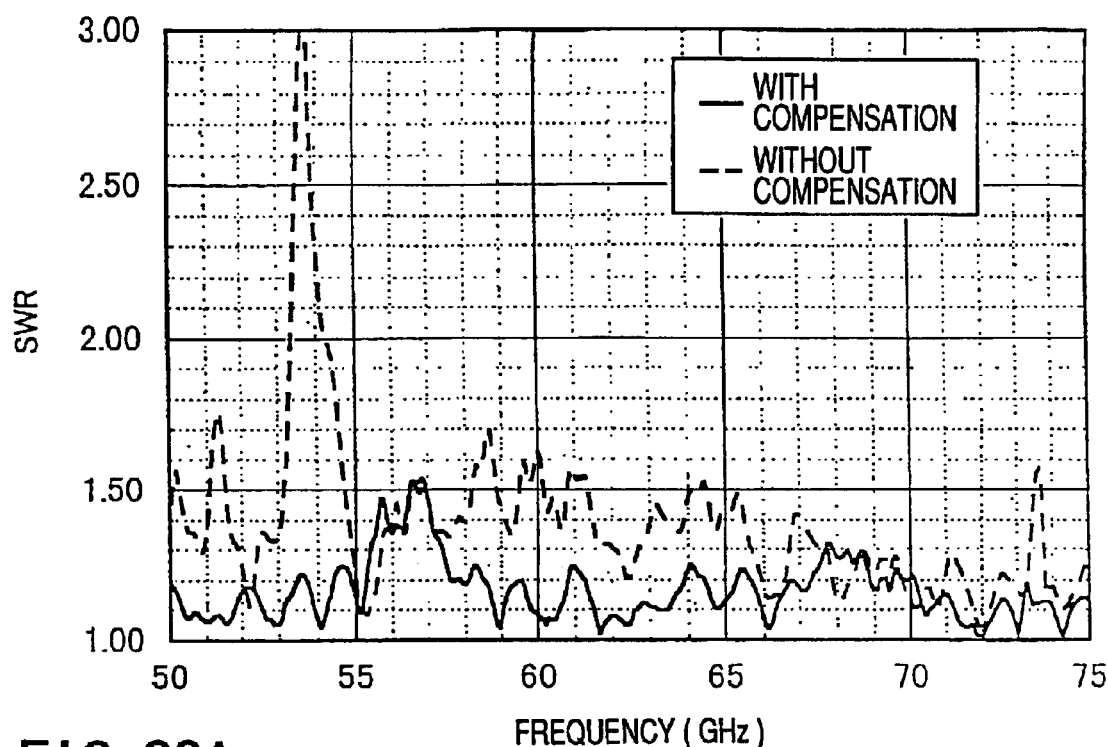
FIGS. 26A and 26B are graphs showing the measurement results of an SWR in the waveguide type wide-band RF signal power detecting device according to the fifth embodiment of the present invention.
Figure 26B:
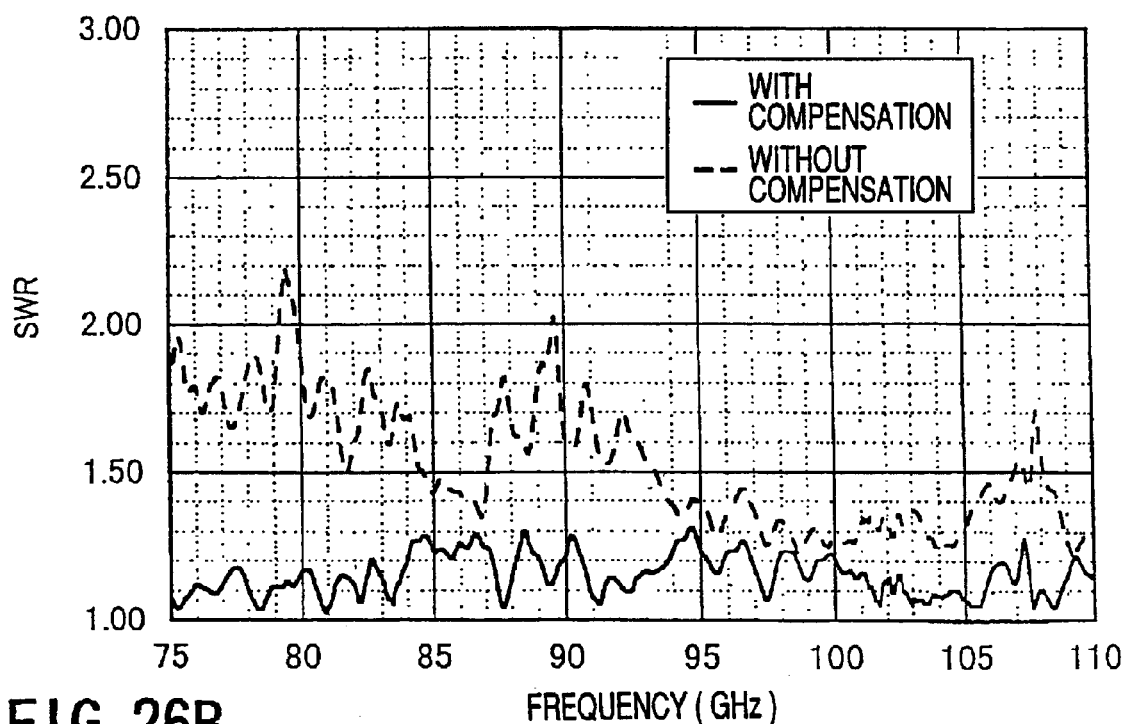

FIGS. 26A and 26B show the measurement results of an SWR in the V band (50 to 75 GHz) and the X band (75 to 110 Hz), respectively, of the waveguide type power detecting device constructed as above.

As shown in FIGS. 26A and 26B, in either of the V band (50 to 75 GHz) and the X band (75 to 110 Hz), the SWR produced in this waveguide type power detecting device with compensation indicated by the solid line is smaller than that produced without compensation indicated by the broken line. That is, in either case the performance greatly improved.

Figure 27:
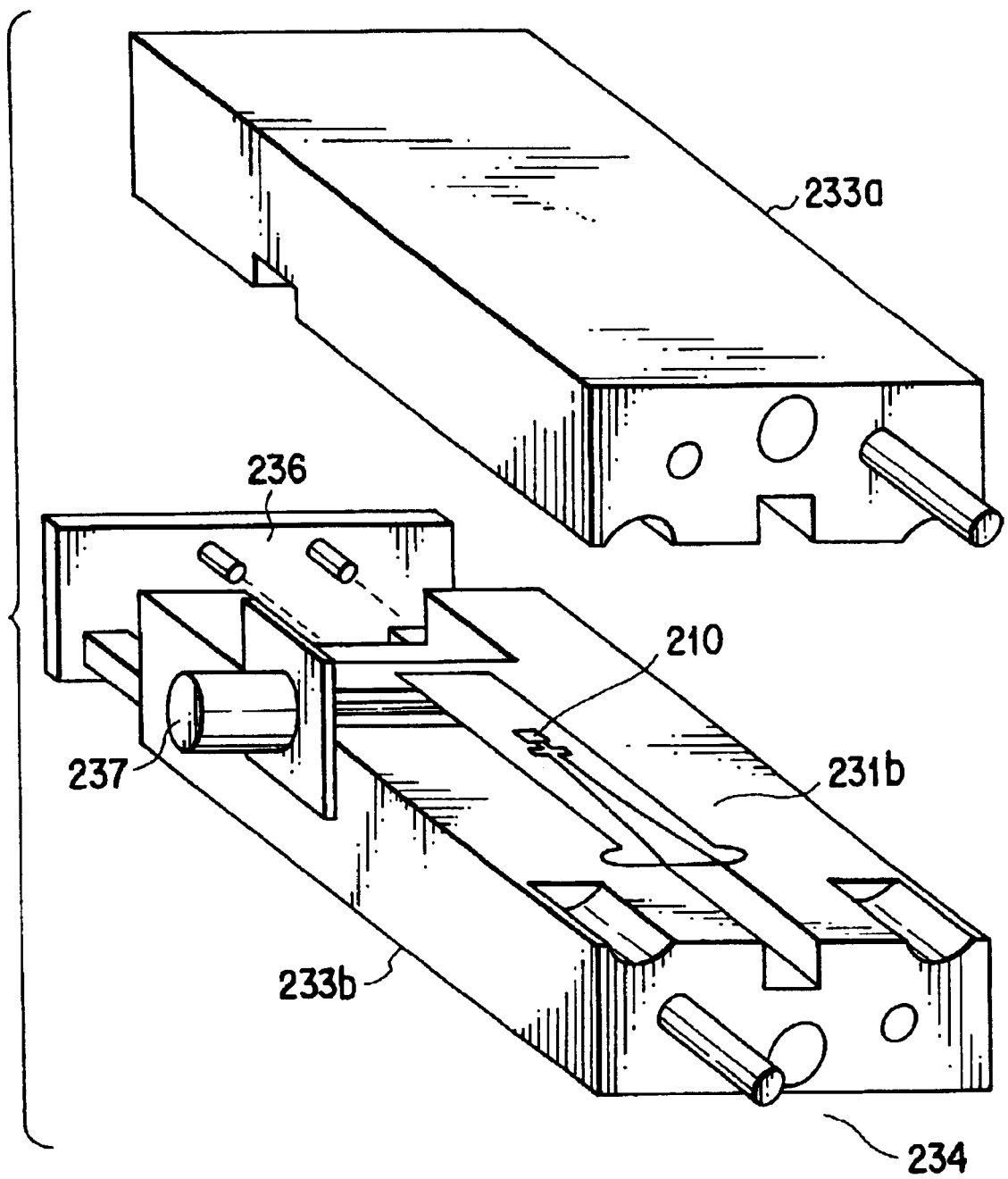
FIG. 27 is a perspective view showing the packaged state of the waveguide type wide-band RF signal power detecting device according to the fifth embodiment of the present invention.

FIG. 27 is a view showing the way the waveguide type power detecting device constructed as above is packaged.

The fin line module substrate 231b mounting the waveguide type power detecting element (power sensor element) 210 is packaged as it is sandwiched between waveguide cases 233a and 233b, split into two parts as casings.

Referring to FIG. 27, an input terminal (WR15 flange) 234 for millimeter-wave signals is formed in the front portion, and sensor output terminals (two DC terminals) 236 are formed in the rear portion.

Also, in FIG. 27 a BNC coaxial input terminal 237 for inputting a calibration signal is formed on one side.

The material of the waveguide cases 233a and 233b, split into two parts as casings, is gold-plated brass (outer dimensions=70×24×24 mm).

The casings for the two, V and W, bands have the same outer dimensions, and the dimensions of their inner waveguides are (3.76×1.88 mm) and (2.54×1.27 mm), respectively.

The dimensional accuracy, angular accuracy, surface roughness, and packaging of these casings were improved. As a consequence, the reflectance of the waveguide itself decreased to 0.05 or less.

Sixth Embodiment

FIGS. 28A and 28B show a waveguide type wide-band RF signal power detecting device (power sensor) according to the sixth embodiment of the present invention.

As a waveguide type wide-band RF signal power detecting element (power sensor element) 254, the waveguide type wide-band RF signal power detecting element (power sensor element) realized in the fifth embodiment described above is used.

As shown in FIGS. 28A and 28B, the power sensor of this embodiment comprises a waveguide connector 251, a module casing 252, a fin line module 253, the power sensor element 254, and a lead line 255. The waveguide connector 251 connects a waveguide (not shown) to the power sensor to guide a signal to be measured propagating in the waveguide to the power sensor. The module casing 252 has a waveguide-shaped hollow portion capable of propagating a signal to be measured. The fin line module substrate 253 is formed in a portion of the waveguide-shaped hollow portion in the module casing 252 and is analogous to that in the fifth embodiment. The power sensor element 254 is formed on this fin line module substrate 253. The lead line 255 guides an output signal from this power sensor element 254 to a dedicated meter.

A signal to be measured propagating in the waveguide (not shown) propagates in the waveguide-shaped hollow portion of the module casing 252, propagates in a fin line electrode formed on the fin line module substrate 253, and is concentrated to be narrowed to the center of this fin line electrode.

The RF signal to be measured thus concentrated to the center of the fin line electrode is absorbed by a resistor of the power sensor element 254 mounted on the fin line module substrate 253 and converted into heat.

The magnitude of the generation of heat by the conversion is directly proportional to the magnitude of the power of the supplied RF signal to be measured.

The magnitude of the heat generation is converted into DC voltage by using a thermocouple placed close to the resistor.

This DC voltage is supplied to the dedicated meter via the lead line and displayed to indicate the magnitude of the power of the RF signal to be measured.

Note that a connector (not shown) for supplying a calibration signal (DC or 1-MHz RF signal) is formed in a portion of the module casing 252.

To minimize reflection of a signal to be measured propagating in the waveguide-shaped hollow portion of the module casing 252, i.e., to measure the signal with high accuracy, the fin line module substrate 253 is placed parallel to the longitudinal direction of the waveguide-shaped hollow portion.

A signal to be measured propagates in the TE mode in the waveguide. Hence, the fin line module substrate 253 placed in the waveguide-shaped hollow portion of the module casing 252 is set parallel to the longitudinal direction of the waveguide-shaped hollow portion and perpendicular to the longitudinal direction of the section of the hollow portion, in order to minimize reflected waves.

To increase the detection sensitivity it is important for this fin line module substrate 253 to maximize a signal supplied from a signal to be measured propagating in the waveguide-shaped hollow portion of the module casing 252.

Accordingly, the fin line module substrate 253 is placed parallel to the longitudinal direction of the waveguide-shaped hollow portion of the module casing 252 and perpendicular to the longitudinal direction of the section of the hollow portion. Additionally, the fin line module substrate 253 is positioned in ⅓ portions of the distances from the centers in the longitudinal directions.

To facilitate packaging the fin line module substrate 253 in the module casing 252, this module casing is desirably constructed of two complementary waveguide casings 252a and 252b.

To suppress reflected waves, the height of projections on the surfaces of the inner walls of the waveguide-shaped hollow portion of the module casing 252 is desirably very small, e.g., 3 $\mu$m or less.

The material of this module casing 252 is desirably copper or brass having high electrical thermal conductivity. However, it is also effective, to decrease the cost, to use plastic having a small linear expansion coefficient as a base material and to cover the surface with plating of an electrically, thermally conductive material, such as gold or nickel.

As the fin line module substrate 253, sapphire or aluminum having a large dielectric constant and a small dielectric loss is used.

As a method of mounting the power sensor element on this fin line module substrate 253, a solder fusing method is used.

To absorb electromagnetic waves leaking outside the surface of the module substrate 253 or to absorb a signal to be measured which is left unabsorbed, a thin-film absorber or an electromagnetic wave absorber, such as polyiron, is desirably placed, or charged, behind the power sensor element, in order to increase the accuracy with which the signal is measured.

In each of the above embodiments, heat generated in the resistor can be efficiently conducted to the thermocouple when the substrate or the module substrate is made of a high-heat-conductivity material.

To efficiently conduct heat generated in the resistor to the thermocouple, a high-heat-conductivity material can also be interposed between the resistor and the thermocouple.

As has been described above, in the first power detecting element of the present invention, one end of a thin-film resistor formed on an insulating substrate is connected to an input electrode formed at one end of the substrate. The other end of this thin-film resistor is connected to a ground electrode formed at the same end of the substrate. A thin-film thermocouple is formed in the vicinity of the thin-film resistor to form a indirect heating structure in which the resistor and the thermocouple are separated. The transmission impedance between a first connecting portion connecting with the input electrode and connecting the input electrode to the thin-film resistor and a second connecting portion connecting with the ground electrode and connecting the ground electrode to the thin-film resistor is held at a predetermined value.

Accordingly, the size of the thin-film resistor can be decreased independently of the thermocouple. Additionally, the upper limit of the measurement frequency can be greatly increased because the transmission impedance viewed from the input electrode and the ground electrode can be well approached to the resistance of the thin-film resistor.

In the second power detecting element of the present invention, the thin-film resistor is made smaller than the input electrode and the ground electrode, and the first connecting portion is widened toward the input electrode. This facilitates mounting the power detecting element.

In the third power detecting element of the present invention, the ground electrode and the second connecting portion are so formed as to sandwich the input electrode and the first connecting portion. This allows the use of a coplanar transmission line. Also, since matching can be easily obtained with respect to the resistance of the thin-film resistor small in size, the upper limit of the measurement frequency can be greatly increased.

The fourth power detecting element of the present invention has two thin-film resistors. This improves the heat resistance and allows measurements of large power.

The fifth power detecting element of the present invention has a structure in which all members are formed using thin films on the substrate. Since this allows easy manufacture, it is possible to provide elements having uniform characteristics inexpensively. A coplanar transmission line is formed by making the ratio of the width of the input electrode and the first connecting portion to the gap between the ground electrode and the second connecting portion substantially constant. Accordingly, the transmission impedance between the input electrode and first connecting portion and the ground electrode and second connecting portion can be easily matched with the resistance of the thin-film resistor. Consequently, the upper limit of the measurement frequency can be greatly increased.

In the sixth power detecting element of the present invention, the thin film resistor and one member of the thermocouple are made of a micro-crystalline silicon germanium thin film. This further facilitates the manufacture, stabilizes the operation, and raises the burnout level. Therefore, highly accurate power detection can be performed.

In the seventh power detecting element of the present invention, a plurality of substantially fan-shaped thermocouples are radially arranged around the thin-film resistor on one surface of the substrate, and these thermocouples are connected in series. Accordingly, a large number of thermocouples can be formed in the limited substrate area, and micro watt power can be measured.

In the first power detecting device of the present invention, the transmission impedance of a central conductor and a ground conductor for guiding a signal to be measured to a power detecting element mounted on a module substrate is made substantially equal to the transmission impedance between electrodes of the power detecting element. Also, the central conductor is given an inductance component corresponding to a capacitance component increased by junctions between mounting portions and the electrodes of the power detecting element. It is, therefore, possible to cancel the capacitance increased by the junctions between the mounting portions and the electrodes of the power detecting element. Additionally, a signal to be measured guided by the central conductor and the ground conductor can be input to a resistor of the power detecting element in a matched state over a broad frequency range. So, the frequency characteristic of the power detecting element can be well brought out, and the upper-limit detection frequency of the whole device can be greatly extended.

Note that the present invention includes the following forms as a coaxial type wide-band RF signal power detecting element (power sensor element), a waveguide type wide-band RF signal power detecting element (power sensor), and a power detecting device using the same.

(1) A wide-band RF signal power detecting element comprising an insulating substrate, at least one thin-film resistor formed on the substrate to absorb power of a signal to be measured and generate heat, first and second ground electrodes formed by thin-film conductors, adjacent to an edge of the substrate, and separated from each other, a first thin-film connecting portion formed on the substrate to electrically connect the first ground electrode to the at least one thin-film resistor, a second thin-film connecting portion formed on the substrate to electrically connect the second ground electrode to the at least one thin-film resistor, and made to narrow a gap between the first and second thin-film connecting portions toward the at least one thin-film resistor, an input electrode formed adjacent to the edge of the substrate and between the first and second ground electrodes, an input connecting portion connected to the at least one thin-film resistor, with the at least one thin-film resistor interposed between the first and second thin-film connecting portions, to electrically connect the input electrode to the at least one thin-film resistor, such that a width of the input connecting portion decreases from the input electrode toward the at least one thin-film resistor, and that gaps between the input connecting portion and the first and second thin-film connecting portions narrow toward the at least one thin-film resistor, and a thin-film thermocouple formed away from the at least one thin-film resistor with a predetermined gap between them to detect a temperature rise of the at least one thin-film resistor.

(2) A wide-band RF signal power detecting element described in item (1) above, characterized in that the at least one thin-film resistor, the first and second ground electrodes, the first and second thin-film connecting portions, the input electrode, and the input connecting portion form a coplanar transmission line.

(3) A wide-band RF signal power detecting element described in item (1) above, characterized in that the at least one thin-film resistor, the first and second ground electrodes, the first and second thin-film connecting portions, the input electrode, and the input connecting portion form a coplanar transmission line, and are so formed as to be equal to transmission impedance of a coaxial cable for propagating the signal to be measured.

(4) A wide-band RF signal power detecting element described in item (1) above, characterized in that the first and second thin-film connecting portions are narrowed.

(5) A wide-band RF signal power detecting element described in item (1) above, characterized in that the at least one thin-film resistor comprises a first thin-film resistor having first and second terminals and a second thin-film resistor having third and fourth terminals, the first thin-film connecting portion is connected to the first terminal of the first thin-film resistor, the second thin-film connecting portion is connected to the fourth terminal of the second thin-film resistor, and the input thin-film connecting portion is connected to the second terminal of the first thin-film resistor and the third terminal of the second thin-film resistor.

(6) A power detecting device comprising a power detecting element comprising an insulating substrate, at least one thin-film resistor formed on the substrate to absorb power of a signal to be measured and generate heat, first and second ground electrodes formed by thin-film conductors, adjacent to an edge of the substrate, and separated from each other, a first thin-film connecting portion formed on the substrate to electrically connect the first ground electrode to the at least one thin-film resistor, a second thin-film connecting portion formed on the substrate to electrically connect the second ground electrode to the at least one thin-film resistor, and made to narrow a gap between the first and second thin-film connecting portions toward the at least one thin-film resistor, an input electrode formed adjacent to the edge of the substrate and between the first and second ground electrodes, an input connecting portion connected to the at least one thin-film resistor, with the at least one thin-film resistor interposed between the first and second thin-film connecting portions, to electrically connect the input electrode to the at least one thin-film resistor, such that a width of the input connecting portion decreases from the input electrode toward the at least one thin-film resistor, and that gaps between the input connecting portion and the first and second thin-film connecting portions narrow toward the at least one thin-film resistor, and a thin-film thermocouple formed away from the at least one thin-film resistor with a predetermined gap between them to detect a temperature rise of the at least one thin-film resistor, and a module substrate made larger than the substrate of the wide-band RF signal power detecting element, and comprising a central conductor and a ground conductor formed by patterning on one surface of the module substrate to guide a signal to be measured, and mount portions formed, in one-to-one correspondence with the electrodes of the wide-band RF signal power detecting element, at a distal end of the central conductor and in a portion of the ground conductor in the vicinity of the distal end of the central conductor, the module substrate fixing the wide-band RF signal power detecting element to the one surface with the electrodes of the power detecting element joined to the mount portions, supplying a signal to be measured to between the electrodes of the wide-band RF signal power detecting element, and outputting a signal corresponding to power of the signal to be measured, characterized in that transmission impedance between the central conductor and the ground conductor of the module substrate is made substantially equal to transmission impedance between the electrodes of the wide-band RF signal power detecting element, and the central conductor is given an inductance component corresponding to a capacitance component increased by junctions between the mount portions and the electrodes of the wide-band RF signal power detecting element.

(7) A wide-band RF signal power detecting device described in item (6) above, characterized in that at least one of the substrate and the module substrate is made of a high-heat-conductivity substrate.

(8) A wide-band RF signal power sensor comprising a module tube, a module substrate inserted into the center of the module tube, a power sensor element mounted on the module substrate, and a lead line for extracting a signal from the power sensor element.

(9) A wide-band RF signal power sensor described in item (8) above, characterized in that a hollow portion of the module tube is filled with an electromagnetic absorber.

(10) A wide-band RF signal power sensor described in item (8) above, characterized in that the module substrate has a coplanar structure.

(11) A wide-band RF signal power sensor described in item (8) above, characterized in that at least one of the substrate and the module substrate is made of a high-heat-conductivity substrate.

(12) A wide-band RF signal power detecting element comprising an insulating substrate, a thin-film resistor formed on the substrate, such that a distal end portion has a predetermined inclination angle to an axial line, to absorb power of a signal to be measured and generate heat, first and second ground electrodes formed by thin-film conductors, adjacent to an edge of the substrate, and separated from each other, a first thin-film connecting portion formed on the substrate to electrically connect the first ground electrode to the thin-film resistor, and a second thin-film connecting portion formed on the substrate to electrically connect the second ground electrode to the thin-film resistor, made to narrow a gap between the first and second thin-film connecting portions toward the thin-film resistor, and connected to the thin-film resistor with the thin-film resistor interposed between the first and second thin-film connecting portions.

(13) A wide-band RF signal power sensor characterized by comprising a waveguide connector for guiding a signal propagating in a waveguide to a power sensor, a module casing including a waveguide type hallow portion, a fin line module substrate formed in a portion of the hollow portion of the module casing, a power sensor element formed on the fin line module substrate, and a lead line for guiding an output signal from the power sensor element to a dedicated meter.

(14) A wide-band RF signal power sensor described in item (13) above, characterized in that the fin line module substrate is set parallel to a longitudinal direction of the waveguide-shaped hollow portion.

(15) A wide-band RF signal power sensor described in item (13) above, characterized in that the fin line module substrate is set parallel to the longitudinal direction of the waveguide-shaped hollow portion and perpendicular to a longitudinal direction of a section of the waveguide-shaped hollow portion.

(16) A wide-band RF signal power sensor described in item (13) above, characterized in that the fin line module substrate is set parallel to the longitudinal direction of the waveguide-shaped hollow portion and perpendicular to a longitudinal direction of a section of the waveguide-shaped hollow portion, and is placed in ⅓ portions from centers in the longitudinal directions.

(17) A wide-band RF signal power sensor described in item (13) above, characterized in that the module casing is constructed of complementary separate casings.

(18) A wide-band RF signal power sensor described in item (13) above, characterized in that the fin line module substrate has a recess by which absolute values of reflection produced in the power sensor element and reflection produced in the fin line module substrate are substantially equal to each other, and a phase difference between them is substantially 180°.

As has been described in detail above, the present invention can provide a wide-band RF signal power detecting element which is easy to manufacture, has a high upper-limit detection frequency, can detect power from direct current, and has a frequency characteristic not influenced by the number of thermocouples.

The present invention can also provide a power detecting device using a wide-band RF power detecting element which is easy to manufacture, has a high upper-limit detection frequency, can detect power from direct current, and has a frequency characteristic not influenced by the number of thermocouples.

What is claimed is:

1. A wide-band RF signal power detecting device comprising:

a wide-band RF signal power detecting element comprising a substrate, a resistor formed on said substrate, electrodes formed on one surface of said substrate and connected to two ends of said resistor, and a thermocouple for outputting a signal corresponding to heat generated by said resistor, and set such that transmission impedance between said electrodes has a predetermined value; and a module substrate made larger than said substrate of said wide-band RF signal power detecting element, and comprising a central conductor and a ground conductor formed by patterning on one surface of said module substrate to guide a signal to be measured, and mount portions formed, in one-to-one correspondence with said electrodes of said wide-band RF signal power detecting element, at a distal end of said central conductor and in a portion of said ground conductor in the vicinity of the distal end of said central conductor, said module substrate fixing said wide-band RF signal power detecting element to the one surface with said electrodes of said power detecting element joined to said mount portions, supplying a signal to be measured to between said electrodes of said power detecting element, and outputting a signal corresponding to power of the signal to be measured, wherein a transmission impedance between said central conductor and said ground conductor of said module substrate is made substantially equal to a transmission impedance between said electrodes of said wide-band RF signal power detecting element, and wherein said central conductor is given an inductance component corresponding to a capacitance component increased by junctions between said mount portions and said electrodes of said wide-band RF signal power detecting element.

2. A device according to claim 1, wherein the inductance component corresponding to the increased capacitance component is formed in the vicinity of said mount portion of said central conductor.

* * * * *